United States Patent
Maunder et al.

(10) Patent No.: US 11,265,020 B2
(45) Date of Patent: Mar. 1, 2022

(54) ELECTRONIC DEVICE WITH BIT PATTERN GENERATION, INTEGRATED CIRCUIT AND METHOD FOR POLAR CODING

(71) Applicant: AccelerComm Limited, Southampton (GB)

(72) Inventors: Robert Maunder, Southampton (GB); Matthew Brejza, Southampton (GB); Shida Zhong, Southampton (GB); Isaac Perez-Andrade, Southampton (GB); Taihai Chen, Southampton (GB)

(73) Assignee: AccelerComm Limited, Southampton (GB)

( * ) Notice: Subject to any disclaimer, the term of this patent is extended or adjusted under 35 U.S.C. 154(b) by 0 days.

(21) Appl. No.: 17/240,080

(22) Filed: Apr. 26, 2021

(65) Prior Publication Data

US 2021/0242886 A1    Aug. 5, 2021

Related U.S. Application Data

(63) Continuation of application No. 16/628,825, filed as application No. PCT/EP2018/065554 on Jul. 4, 2018, now Pat. No. 11,043,972.

(30) Foreign Application Priority Data

Sep. 11, 2017   (GB) ..................... 1714559
Oct. 10, 2017   (GB) ..................... 1711055

(51) Int. Cl.
*H03M 7/00*       (2006.01)
*H03M 13/13*      (2006.01)
(Continued)

(52) U.S. Cl.
CPC ............. *H03M 13/13* (2013.01); *G06F 7/76* (2013.01); *H03M 13/6575* (2013.01)

(58) Field of Classification Search
CPC .. H03M 13/13; H03M 13/6575; H03M 13/00; H03M 13/618; H03M 13/6356;
(Continued)

(56) References Cited

U.S. PATENT DOCUMENTS 4,119,946 A * 10/1978 Taylor .................... G10L 15/00
                                                  382/222
5,043,988 A *  8/1991 Brglez .................... G06F 1/03
                                                  714/739

(Continued)

OTHER PUBLICATIONS

Lin Jun et al: "Efficient Soft Cancelation Decoder Architectures for Polar Codes11 , IEEE Transactions on Very Large Scale Integration (VLSI) Systems, IEEE Service Center, Piscataway, NJ, USA, vol. 25, No. 1, Jan. 2017 (Jan. 2017), pp. 87-99, XP011637698, ISSN: 1063-8210, DOI: 10.1109/TVLSI.2016.2577883 retrieved on Dec. 26, 2016] Section IV.A, last paragraph; figure 11 Section IV.A 1)"Top Level Structure11.

(Continued)

*Primary Examiner* — Jean B Jeanglaude
(74) *Attorney, Agent, or Firm* — Optimus Patents US, LLC

(57) ABSTRACT

An electronic device configured to perform polar coding is described. The electronic device includes a bit pattern generator (3403) configured to successively perform a bit pattern generation process over a series ($t=\lceil n/w \rceil$) of clock cycles; and a counter (c, 4203), operably coupled to the bit pattern generator (3403) and configured to count a number of successive bit pattern generation sub-processes over the series ($t=\lceil n/w \rceil$) of clock cycles. The bit pattern generator (3403) is configured to: provide a successive sub-set of (w) bits from a bit pattern vector ($b_{k,n}$) in each successive $t=\lceil n/w \rceil$ clock cycle; where the bit pattern vector comprises n bits, of which 'k' bits adopt a first binary value and n–k bits adopt a complementary binary value.

20 Claims, 24 Drawing Sheets

(51) Int. Cl.
*G06F 7/76* (2006.01)
*H03M 13/00* (2006.01)

(58) Field of Classification Search
CPC ......... H03M 13/6362; H03M 13/6508; H03M 7/40; H03M 7/00; G06F 7/76
USPC ..................................................... 341/50, 51
See application file for complete search history.

(56) References Cited

U.S. PATENT DOCUMENTS

| | | | | |
|---|---|---|---|---|
| 8,228,750 | B2* | 7/2012 | Chakravarty | G11C 29/40 365/201 |
| 8,250,420 | B2* | 8/2012 | Hapke | G01R 31/31919 714/728 |
| 9,223,720 | B2* | 12/2015 | Chase | G06F 16/9014 |
| 2005/0154953 | A1* | 7/2005 | Norskog | H04L 1/244 714/738 |
| 2009/0013227 | A1* | 1/2009 | Krishnakalin | G01R 31/318547 714/728 |
| 2010/0117658 | A1* | 5/2010 | Hapke | G01R 31/31919 324/537 |
| 2012/0063248 | A1* | 3/2012 | Chakravarty | G11C 29/40 365/201 |

OTHER PUBLICATIONS

Gabi Sarkis et al: "Flexible and Low-Complexity Encoding and Decoding of Systematic Polar Codes", IEEE Transactions on Comnunications, Jan. 2016 (Jan. 2016), pp. 2732-2745, XP055336370, New York DOI: 10.1109/TCOMM.2016.2574996 Retrieved from the Internet: URL:https://arxiv.org/pdf/1507.03614v3.pdf the whole document.

Huawei et al: 11 Design Aspects of Polar and LDPC codes for NR11, 3GPP Draft; RI-1613300, 3rd Generation Partnership Project (3GPP), Mobile Competence Centre ; 650, Route Des Lucioles ; F-06921 Sophia-Antipolis Cedex ; France , vol. RAN WGI, No. Reno, USA; Nov. 14, 2016-Nov. 18, 2016 Nov. 19, 2016 (Nov. 19, 2016), XP051191169, Retrieved from the Internet: URL:http://www.3gpp.org/ftp/tsg -ran/WGI -RL 1/TSGRI 87/Docs/ [retrieved on Nov. 19, 2016] the whole document.

* cited by examiner

| step | ROM | shifter input | $P_j$ | $R_j$ | $C_j$ | insert input | output | buffer |
|---|---|---|---|---|---|---|---|---|
| 0 | 0101 | 4321000 | 2 | 0 | 3 | 0004321 | 0201 | 043 |
| 1 | 1011 | 8765043 | 3 | 2 | 1 | 0876543 | 5043 | 876 |
| 2 | 0110 | xxxx876 | 2 | 3 | 0 | 0000876 | 0760 | 008 |
| 3 | 1100 | 0009008 | 2 | 1 | 2 | 0000098 | 9800 | 000 |

3600

| k | n | bit pattern vector $b_{k,n}$ |
|---|---|---|
| 1 | 2 | 01 |
| 1 | 4 | 0001 |
| 2 | 4 | 0011 |
| 3 | 4 | 0111 |
| 1 | 8 | 00000001 |
| 2 | 8 | 00000011 |
| 3 | 8 | 00000111 |
| 4 | 8 | 00010111 |
| 5 | 8 | 00011111 |
| 6 | 8 | 00111111 |
| 7 | 8 | 01111111 |
| 1 | 16 | 0000000000000001 |
| 2 | 16 | 0000000000000011 |
| 3 | 16 | 0000000000000111 |
| 4 | 16 | 0000000000010111 |
| 5 | 16 | 0000000100010111 |
| 6 | 16 | 0000000100011111 |
| 7 | 16 | 0000000100111111 |
| 8 | 16 | 0000000101111111 |
| 9 | 16 | 0000001101111111 |
| 10 | 16 | 0000011101111111 |
| 11 | 16 | 0001011101111111 |
| 12 | 16 | 0001011111111111 |
| 13 | 16 | 0001111111111111 |
| 14 | 16 | 0011111111111111 |
| 15 | 16 | 0111111111111111 |

3700

| $n$ | rank vector $R_n$ |
|---|---|
| 2 | [1 0] |
| 4 | [3 2 1 0] |
| 8 | [7 6 5 3 4 2 1 0] |
| 16 | [15 14 13 10 12 9 8 4 11 7 6 3 5 2 1 0] |
| 32 | [31 30 29 25 28 24 23 16 27 22 21 14 19 13 11 5 26 20 18 12 17 10 9 4 15 8 7 3 6 2 1 0] |

3900

| address c | index i | | | | | | | |
|---|---|---|---|---|---|---|---|---|
| | 0 | 1 | 2 | 3 | 4 | 5 | 6 | 7 |
| 0 | 63 | 62 | 61 | 59 | 55 | 47 | 31 | 60 |
| 1 | 58 | 57 | 54 | 53 | 46 | 51 | 45 | 30 |
| 2 | 43 | 29 | 39 | 27 | 56 | 23 | 52 | 15 |
| 3 | 50 | 44 | 49 | 42 | 28 | 41 | 38 | 22 |
| 4 | 25 | 37 | 26 | 35 | 21 | 14 | 48 | 13 |
| 5 | 19 | 40 | 11 | 7 | 36 | 24 | 34 | 20 |
| 6 | 33 | 12 | 18 | 10 | 17 | 6 | 9 | 5 |
| 7 | 3 | 32 | 16 | 8 | 4 | 2 | 1 | 0 |

| address c | index i | | | | | | | |
|---|---|---|---|---|---|---|---|---|
| | 0 | 1 | 2 | 3 | 4 | 5 | 6 | 7 |
| 0 | 63 | 62 | 61 | 59 | 57 | 47 | 45 | 60 |
| 1 | 58 | 55 | 56 | 53 | 46 | 51 | 43 | 44 |
| 2 | 39 | 41 | 31 | 37 | 54 | 29 | 52 | 15 |
| 3 | 50 | 42 | 49 | 38 | 40 | 35 | 30 | 28 |
| 4 | 33 | 27 | 36 | 23 | 25 | 14 | 48 | 13 |
| 5 | 21 | 34 | 11 | 9 | 26 | 32 | 22 | 24 |
| 6 | 19 | 12 | 20 | 10 | 17 | 8 | 7 | 5 |
| 7 | 3 | 18 | 16 | 6 | 4 | 2 | 1 | 0 |

| address c | index i | | | |
|---|---|---|---|---|
| | 0 | 1 | 2 | 3 |
| 0 | 0 | 1 | 2 | 3 |
| 1 | 4 | 5 | 8 | 9 |
| 2 | 6 | 7 | 10 | 11 |
| 3 | 12 | 13 | 14 | 15 |
| 4 | 16 | 17 | 20 | 21 |
| 5 | 24 | 25 | 28 | 29 |
| 6 | 32 | 33 | 36 | 37 |
| 7 | 40 | 41 | 44 | 45 |
| 8 | 18 | 19 | 22 | 23 |
| 9 | 26 | 27 | 30 | 31 |
| 10 | 34 | 35 | 38 | 39 |
| 11 | 42 | 43 | 46 | 47 |
| 12 | 48 | 49 | 50 | 51 |
| 13 | 52 | 53 | 56 | 57 |
| 14 | 54 | 55 | 58 | 59 |
| 15 | 60 | 61 | 62 | 63 |

| address c | index i | | | |
|---|---|---|---|---|
| | 0 | 1 | 2 | 3 |
| 0 | 63 | 62 | 61 | 56 |
| 1 | 60 | 55 | 53 | 43 |
| 2 | 59 | 54 | 51 | 42 |
| 3 | 49 | 39 | 37 | 23 |
| 4 | 58 | 52 | 50 | 40 |
| 5 | 47 | 36 | 31 | 21 |
| 6 | 45 | 32 | 34 | 19 |
| 7 | 28 | 17 | 15 | 6 |
| 8 | 57 | 48 | 46 | 35 |
| 9 | 44 | 33 | 30 | 18 |
| 10 | 41 | 29 | 27 | 16 |
| 11 | 25 | 14 | 12 | 5 |
| 12 | 38 | 26 | 24 | 13 |
| 13 | 22 | 11 | 10 | 4 |
| 14 | 20 | 9 | 8 | 3 |
| 15 | 7 | 2 | 1 | 0 |

4600

| clock cycle $c_3$ | $b_4[0]$ | $b_4[1]$ | $b_4[2]$ | $b_4[3]$ |
|---|---|---|---|---|
| 0 | 0 | 0 | 0 | 0 |
| 1 | 0 | 0 | 0 | 0 |
| 2 | 0 | 0 | 0 | 0 |
| 3 | 0 | 0 | 0 | 1 |
| 4 | 0 | 0 | 0 | 0 |
| 5 | 0 | 0 | 1 | 1 |
| 6 | 0 | 0 | 0 | 1 |
| 7 | 1 | 1 | 1 | 1 |
| 8 | 0 | 0 | 0 | 0 |
| 9 | 0 | 0 | 1 | 1 |
| 10 | 0 | 1 | 1 | 1 |
| 11 | 1 | 1 | 1 | 1 |
| 12 | 0 | 1 | 1 | 1 |
| 13 | 1 | 1 | 1 | 1 |
| 14 | 1 | 1 | 1 | 1 |
| 15 | 1 | 1 | 1 | 1 |

| clock cycle $c_3$ | $b_4[0]$ | $b_4[1]$ | $b_4[2]$ | $b_4[3]$ |
|---|---|---|---|---|
| 0 | 0 | 0 | 0 | 0 |
| 1 | 0 | 0 | 0 | 0 |
| 2 | 0 | 0 | 0 | 0 |
| 3 | 0 | 1 | 1 | 1 |
| 4 | 0 | 0 | 0 | 0 |
| 5 | 0 | 1 | 1 | 1 |
| 6 | 0 | 1 | 1 | 1 |
| 7 | 1 | 1 | 1 | 1 |
| 8 | 0 | 0 | 0 | 1 |
| 9 | 0 | 1 | 1 | 1 |
| 10 | 0 | 1 | 1 | 1 |
| 11 | 1 | 1 | 1 | 1 |
| 12 | 1 | 1 | 1 | 1 |
| 13 | 1 | 1 | 0 | 0 |
| 14 | 1 | 1 | 0 | 0 |
| 15 | 0 | 0 | 0 | 0 |

| clock cycle $c_3$ | bit pattern $b_4[0]$ | $b_4[1]$ | $b_4[2]$ | $b_4[3]$ |
|---|---|---|---|---|
| 0 | 0 | 0 | 0 | 0 |
| 1 | 0 | 0 | 0 | 0 |
| 2 | 0 | 0 | 0 | 0 |
| 3 | 0 | 0 | 0 | 0 |
| 4 | 0 | 0 | 0 | 0 |
| 5 | 0 | 0 | 0 | 1 |
| 6 | 0 | 0 | 0 | 1 |
| 7 | 0 | 1 | 1 | 1 |
| 8 | 0 | 0 | 0 | 0 |
| 9 | 0 | 0 | 0 | 1 |
| 10 | 0 | 0 | 0 | 1 |
| 11 | 0 | 1 | 1 | 1 |
| 12 | 0 | 0 | 1 | 1 |
| 13 | 1 | 1 | 1 | 1 |
| 14 | 1 | 1 | 1 | 1 |
| 15 | 1 | 1 | 1 | 1 |

—5000

ELECTRONIC DEVICE WITH BIT PATTERN GENERATION, INTEGRATED CIRCUIT AND METHOD FOR POLAR CODING

FIELD OF THE INVENTION

The field of the invention relates to an electronic device configured to perform polar coding and a method for bit pattern generation. The invention is applicable to, but not limited to, a bit pattern generation for a polar encoder and a polar decoder for current and future generations of communication standards.

BACKGROUND OF THE INVENTION

In accordance with the principles of Forward Error Correction (FEC) and channel coding, polar coding [1] may be used to protect information against the effects of transmission errors within an imperfect communication channel, which may suffer from noise and other detrimental effects. More specifically, a polar encoder is used in the transmitter to encode the information and a corresponding polar decoder is used in the receiver to mitigate transmission errors and recover the transmitted information. The polar encoder converts an information block comprising K bits into an encoded block comprising a greater number of bits M>K, according to a prescribed encoding process. In this way, the encoded block conveys the K bits of information from the information block, together with M−K bits of redundancy. This redundancy may be exploited in the polar decoder according to a prescribed decoding process, in order to estimate the values of the original K bits from the information block. Provided that the condition of the communication channel is not too severe, the polar decoder can correctly estimate the values of the K bits from the information block with a high probability.

The polar encoding process comprises three steps. In a first information block conditioning step, redundant bits are inserted into the information block in prescribed positions, in order to increase its size from K bits to N bits, where N is a power of two. In a second polar encoding kernal step, the N bits of the resultant kernal information block are combined in different combinations using successive eXclusive OR (XOR) operations, according to a prescribed graph structure. This graph structure comprises $n=\log_2(N)$ successive stages, each comprising N/2 XOR operations, which combine particular pairs of bits. In a third step, encoded block conditioning is applied to the resultant kernal encoded block, in order to adjust its size from N bits to M bits. This may be achieved by repeating or removing particular bits in the kernal encoded block according to a prescribed method, in order to produce the encoded block, which is transmitted over a channel or stored in a storage media.

A soft encoded block is received from the channel or retrieved from the storage media. The polar decoding process comprises three steps, which correspond to the three steps in the polar encoding process, but in a reverse order. In a first encoded block conditioning step, redundant soft bits are inserted or combined into the soft encoded block in prescribed positions, in order to adjust its size from M soft bits to N soft bits, where N is a power of two. In a second polar decoding kernal step, the N soft bits of the resultant kernal encoded block are combined in different combinations using a Successive Cancellation (SC) [1] or Successive Cancellation List (SCL) [7] process, which operates on the basis of the prescribed graph structure. In a third step, information block conditioning is applied to the resultant recovered kernal information block, in order to reduce its size from N bits to K bits. This may be achieved by removing particular bits in the recovered kernal information block according to a prescribed method, in order to produce the recovered information block.

In a context of a polar encoder, the information block conditioning component 101 interlaces the K information bits with N−K redundant bits, which may be frozen bits [1], Cyclical Redundancy Check (CRC) bits [2], Parity Check (PC)-frozen bits [3], User Equipment Identification (UE-ID) bits [4], or hash bits [5], for example. Here, frozen bits may always adopt a logic value of '0', while CRC or PC-frozen bits or hash bits may adopt values that are obtained as functions of the information bits, or of redundant bits that have already been interlaced earlier in the process. The information block conditioning component 101 generates redundant bits and interlaces them into positions that are identified by a prescribed method, which is also known to the polar decoder. The information block conditioning component 101 may also include an interleaving operation, which may implement a bit-reversal permutation [1] for example.

In a context of a polar encoder, the encoded block conditioning component 103 may use various techniques to generate the 'M' encoded bits in the encoded block 107, where 'M' may be higher or lower than 'N'. More specifically, repetition [6] may be used to repeat some of the 'N' bits in the kernel encoded block, while shortening or puncturing techniques [6] may be used to remove some of the 'N' bits in the kernel encoded block. Note that shortening removes bits that are guaranteed to have logic values of '0', while puncturing removes bits that may have either of logic '0' or '1' values. The encoded block conditioning component may also include an interleaving operation.

The input to the encoded block conditioning component 110 of the polar decoder is a soft encoded block. In order to convert the M encoded LLRs into 'N' kernal encoded LLRs, infinite-valued LLRs may be interlaced with the soft encoded block 109, to occupy the positions within the soft kernal encoded block that correspond to the '0'-valued kernal encoded bits that were removed by shortening in the polar encoder. Likewise, '0'-valued LLRs may be interlaced with the soft encoded block 109, to occupy the positions where kernal encoded bits were removed by puncturing. In the case of repetition, the LLRs that correspond to replicas of a particular kernal encoded bit may be summed and placed in the corresponding position within the soft kernal encoded block 109. A corresponding deinterleaving operation may also be performed, if interleaving was employed within the encoded block conditioning component 103 of the polar encoder.

The input to the information block conditioning component 112 of the polar decoder is a recovered kernal information block 114. The recovered information block may be obtained by removing all redundant bits from the recovered kernal information block 114. A corresponding deinterleaving operation may also be performed, if interleaving was employed within the information block conditioning component 101 of the polar encoder.

During the implementation of the four block conditioning components, it is challenging to achieve the flexibility that is required to enable bits or soft bits (which may be represented in the form of LLRs) to be inserted into or removed from arbitrary positions within the corresponding blocks, where these positions vary depending on the particular combination of K, N and M. This is particularly challenging in the implementation of flexible polar encoders and decoders, which allow K, N and M to vary from block to block, during run-time. It is particularly challenging to implement these flexible block conditioning components with a low hardware usage and the ability to complete the block conditioning processes within a low number of clock cycles. Owing to this challenge, all previous implementations [14, 15] of the block conditioning components have only processed one bit or soft bit per clock cycle, requiring a total of N clock cycles to complete the process.

SUMMARY OF THE INVENTION

The present invention provides an electronic device configured to perform polar coding using block conditioning circuits, an integrated circuit and a method for block conditioning, as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIG's are illustrated for simplicity and clarity and have not necessarily been drawn to scale.

DETAILED DESCRIPTION

Figure 1:
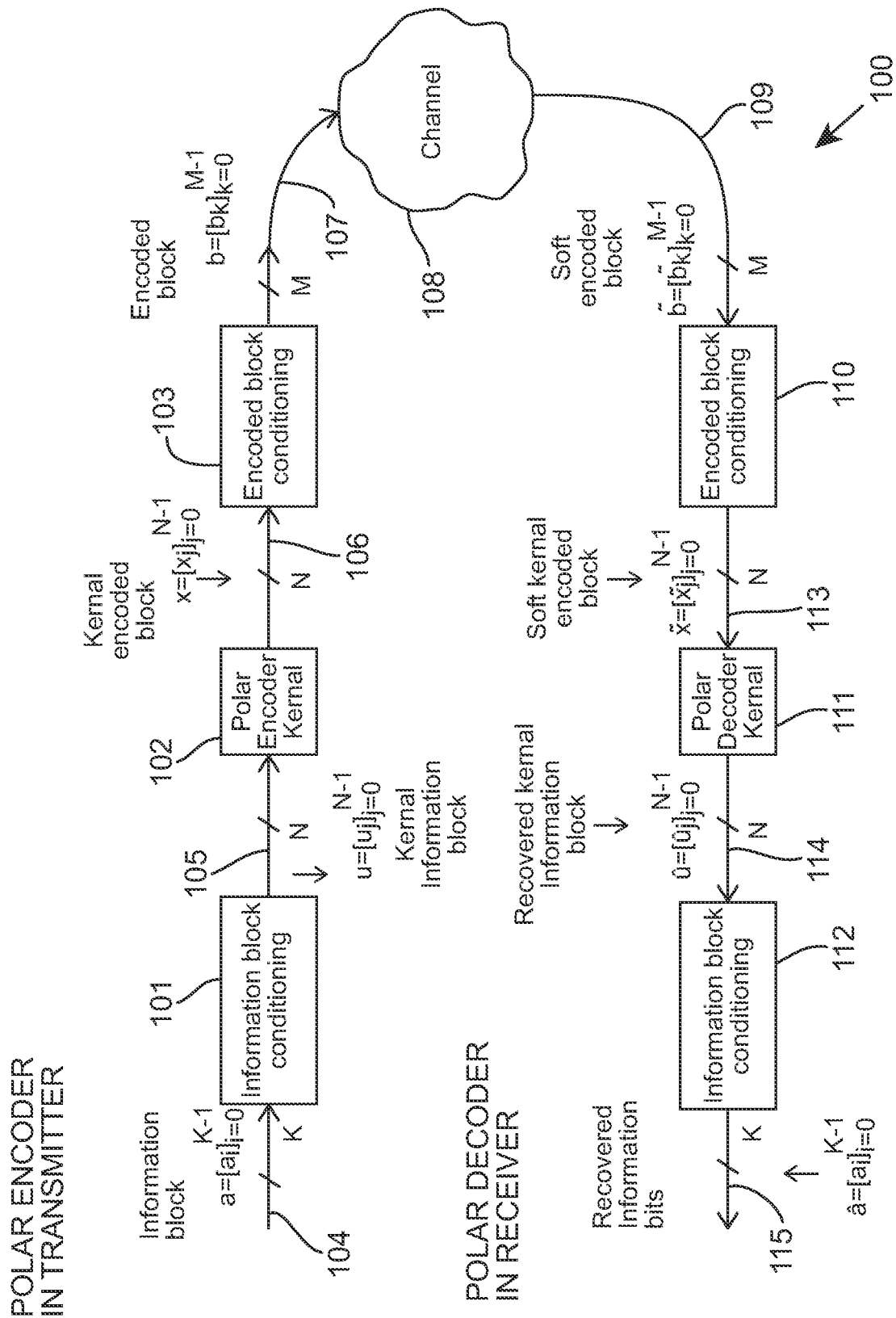
FIG. 1 illustrates an example top-level schematic of a communication unit having a polar encoder and polar decoder, adapted according to example embodiments of the invention.

Several sequences have been proposed for the selection of information bits during information block conditioning within a polar encoder [8-12]. These sequences may be used to obtain a bit pattern vector $b_{k,n}$, in which k out of n bits have the value '1', where n is a power of two greater than k. These 1-valued bits identify the positions where the k information bits should be inserted into the n-bit kernal information block. The process of generating the bit pattern may be completed over a series of $t=\lceil n/w \rceil$ clock cycles at the start of the polar encoding process, where a sub-process of the bit pattern generation process is completed in each successive clock cycle. Here, successive sub-sets of w bits from the bit pattern vector $b_{k,n}$ may be used to control the insertion of information bits into successive sub-sets of w bits for the kernal information block. Throughout this process, these successive w-bit sub-sets of the kernal information block may be simultaneously funneled into a polar encoder kernal having a corresponding input width of w, such as the design of [13], which has demonstrated w=32. In this way, the insertion of the k information bits into the n-bit kernal information block may impose no additional latency upon the polar encoding process. Likewise, similar benefits can be obtained in the polar decoder, when extracting the k recovered information bits from the recovered kernal information block. Note that the proposed approach processes w pattern bits in each step, which is in contrast to the block conditioning modules of previous efforts [14, 15], which are only capable of processing a single pattern bit in each step.

In a first aspect, examples of the present invention an electronic device configured to perform polar coding is described. The electronic device includes a bit pattern generator configured to successively perform a bit pattern generation process over a series $(t=\lceil n/w \rceil)$ of clock cycles; and a counter, operably coupled to the bit pattern generator and configured to count a number of successive bit pattern generation sub-processes over the series $(t=\lceil n/w \rceil)$ of clock cycles. The bit pattern generator is configured to: provide a successive sub-set of (w) bits from a bit pattern vector $(b_{k,n})$ in each successive $t=\lceil n/w \rceil$ clock cycle; where the bit pattern vector comprises n bits, of which 'k' bits adopt a first binary value and n–k bits adopt a complementary binary value.

In this manner, parallel processing may be used to reduce the number of clock cycles required to complete the bit pattern generation process.

In some examples, the bit pattern generator circuit may include a bank of (w) comparators, and wherein each of w bit pattern bits $\{b_0, b_1, b_2, \ldots, b_{w-1}\}$ may be obtained from a corresponding comparator in the bank of w comparators.

In this manner, w bit patterns bits may be generated in each clock cycle, using only low complexity hardware.

In some examples, the bit pattern generator is configured to perform the bit pattern generation process as a part of at least one of: an information block conditioning circuit in an encoder that receives an information block as the input data block and outputs an n-bit kernal information block; an encoded block conditioning circuit in an encoder that receives an n-bit kernal encoded block as the input data block and outputs an encoded block; an encoded block conditioning circuit in a decoder that receives a soft encoded block as the input data block and outputs an n-soft-bit soft kernal encoded block; an information block conditioning circuit in a decoder that receives an n-bit recovered kernal information block as the input data block and outputs a recovered information block. In some examples, the bit pattern generator may be configured to perform in at least one of: an interlacer whereby successive w-bit sub-sets of the kernel information block are funneled into a polar encoder kernal) having a corresponding input width of 'w' bits; and an interlacer whereby successive w-soft-bit sub-sets of the soft kernal encoded block are funneled into a polar decoder kernal having a corresponding input width of soft bits. In this manner, parallel processing may be used to reduce the number of clock cycles required to complete the block conditioning and interlacing processes.

In some examples, the bit pattern generator may be configured to obtain the bit pattern vector $(b_{k,n})$ in which 'k' out of 'n' bits has the first binary value and 'n–k' out of 'n' bits has the complementary binary value, where n is a power of two greater than k. In this manner, compatibility is ensured with the polar coding kernal process, which operates on blocks having a length which is a power of two.

In some examples, the bit pattern generator circuit may be operably coupled to a bit pattern Read Only Memory, ROM, and configured to store therein a set of supported bit pattern vectors $(b_{k,n})$. In this manner, any arbitrary set of bit patterns may be supported, even if there are no nested relationships between them. In some examples, the set of supported bit pattern vectors, $b_{k,n}$, may be generated in an off-line pre-computation process and stored in the bit pattern ROM for reading from during an on-line bit pattern generation process. In this manner, no on-line computation is required, reducing the on-line complexity of the bit pattern generator. In some examples, the bit pattern ROM may have a width of 'w' bits and each bit pattern vector $(b_{k,n})$ may be stored across a number $\lceil n/w \rceil$ of consecutive addresses, wherein for some examples, for n<w, the bit pattern vector $(b_{k,n})$ may be appended with a number, w–n, of dummy bits, such that bit pattern vector $(b_{k,n})$ occupies a width of a single address in the bit pattern ROM. In this manner, 'w' bit pattern bits may be read in each clock cycle, reducing the number of clock cycles required to obtain the complete bit pattern vector. Furthermore, the special case of very short bit pattern vectors can be accommodated naturally, without the requirement for a separate solution.

In some examples, the bit pattern ROM may be operably coupled to a first look-up table, wherein the values of 'k' and 'n' are used as an input to as well as to index the first look-up table in order to identify a start address of each respective bit pattern vector $(b_{k,n})$ In this manner, each bit pattern vector can be located within the bit pattern ROM without the requirement for any on-line computation, for example. In some examples, the counter may be operably coupled to the bit pattern ROM, and configured to increment a counter value from '0' to 't–1' wherein the counter value may be used as an offset from a start address of the bit pattern ROM in order to read successive w-element sub-sets ($b_0$, $b_1$, $b_2$, ..., $b_{w-1}$) of the bit pattern vector ($b_{k,n}$). In this manner, the bit pattern vector may be read from the bit pattern ROM using only low complexity addressing hardware.

In some examples, the bit pattern generator may include a rank ROM configured to store information sufficient to obtain a rank vector ($R_n$) for each supported length of the bit pattern, 'n'. In this manner, the ROM capacity may be significantly reduced relative to storing each supported bit pattern vector separately. Furthermore, the rank vector $R_n$ may be used to generate the bit pattern vector $b_{k,n}$ without the requirement for a complex sort or interleaving operation, as is required when using the index vector $Q_n$ as the basis of the bit pattern generation process. In some examples, the rank vector ($R_n$) for a particular length of the bit pattern, 'n', may include integers in a range of '0' to 'n−1', permuted in an order that corresponds to a rank of each bit position. In some examples, a rank may indicate a maximum value for the number 'k' out of 'n' bits in the bit pattern adopting the first binary value, for which a corresponding bit in the bit pattern vector ($b_{k,n}$) has the complementary binary value. In this manner, the rank vector contains all information necessary to generate all bit pattern vectors having the length of 'n' bits, when the bit pattern vectors obey the nested property.

In some examples, a length of the bit pattern n may be used to index a second look-up table, in order to identify the start address of each particular rank vector ($R_n$). In this manner, each bit pattern vector can be located within the bit pattern ROM without the requirement for any on-line computation, for example. In some examples, the rank ROM may include multiple multiplexed rank ROMs, wherein one multiplexed rank ROM may be configured to store the rank vector ($R_n$) corresponding to each supported value of the length of the bit pattern 'n'. In this manner, each separate multiplexed rank ROM may adopt a different bit width for the stored fixed-point numbers. Also, the requirement for a look up table to store the start addresses is eliminated. In some examples, the bit pattern vector ($b_{k,n}$) may be generated for a respective combination of the number, k, of bits in the bit pattern adopting the first binary value and the length of the bit pattern 'n' using the bank of (w) comparators that may be configured to compare each element of the rank vector ($R_n$) with 'k'. In some examples, each comparison of the element of the rank vector ($R_n$) with 'k' may be performed to determine whether the element is less than 'k'. In this manner, w bits of the bit pattern vector may be generated in each clock cycle, using only low complexity hardware. In some examples, all entries in the rank ROM may be stored using fixed point numbers having a width of $\log_2(n_{max})$ bits, where $n_{max}$ is a maximum of the supported bit pattern lengths. In this manner, a common fixed point number width is used throughout the bit pattern generator, avoiding the requirement to convert between fixed point number widths. In some examples, all entries in the rank ROM for particular values of n may be stored using fixed point numbers having a width of $\log_2(n)$ bits. In some examples, each address of the rank ROM may be configured to store w fixed-point numbers. In this manner, the ROM capacity may be reduced relative to using a constant fixed point number width for all value of n. In some examples, the rank ROM, in cases where n<w, may be configured to append the rank vector ($R_n$) with w−n dummy elements, such that the rank vector ($R_n$) occupies a width of a single address in the rank ROM. In this manner, the special case of very short bit pattern vectors can be accommodated naturally, without the requirement for a separate solution.

In some examples, the rank ROM may be operably coupled to the counter, such that during each successive sub-process of the bit pattern generation process, the counter may be configured to increment a counter value from '0' to 't−1' wherein the counter value may be used as an offset from a start address of the rank ROM in order to read successive w-element sub-sets of the rank vector ($R_n$). In this manner, the bit pattern vector may be read from the bit pattern ROM using only low complexity addressing hardware. In some examples, a bit pattern bit of the bit pattern vector $b_{k,n}$ may be obtained by representing both a rank value and k using a two's complement fixed-point number representation, and the bit pattern generator circuit may perform a twos complement subtraction of 'k' from the rank value and then use a most significant bit, MSB, as a value of the bit pattern bit. In this manner, the bit pattern bit may be obtained using only low complexity hardware.

In some examples, the rank ROM may be configured to store a first half of each rank vector ($R_n$), when the bit pattern vectors ($b_{k,n}$) follow a symmetric property. In some examples, the symmetric property may be satisfied if any pair of elements in the rank vector ($R_n$) having the indices i and n−i−1 sum to n−1, for all n and for all i∈[0,n−1]. In some examples, the rank ROM may include a width of 'w' ranks, such that only a first half of each rank vector ($R_n$) is stored across $\lceil n/(2w) \rceil$ consecutive addresses, where n is a bit pattern length supported by the rank vector ($R_n$). In this manner, the capacity of the rank ROM may be reduced by 50% relative to storing the entirety of each rank vector.

In some examples, for n/2<w, the rank vector ($R_n$) may be appended with 'w−n' dummy elements and stored across a width of a single address in the rank ROM. In this manner, the special case of very short bit pattern vectors can be accommodated naturally, without the requirement for a separate solution.

In some examples, during a first half of successive operations of the bit pattern generation process when $c < \lceil n/(2w) \rceil$, successive w-element sub-sets of the rank vector ($R_n$) may be obtained from incremental addresses in the rank ROM 3801, where the offset from the start address of the rank ROM may be given by c. In this manner, the bit pattern vector may be read from the bit pattern ROM using only low complexity addressing hardware. In some examples, the electronic device may further include a bank of w multiplexers operably coupled to the rank ROM, wherein during a first half of successive operations of the bit pattern generation process the bank of w multiplexers may maintain the order of the w pattern bits $\{b_0, b_1, b_2, ..., b_{w-1}\}$. In some examples, a bit pattern bit of the bit pattern vector $b_{k,n}$ may be obtained by representing both a rank value and k using a two's complement fixed-point number representation, and the bit pattern generator circuit perform a subtraction of 'k' from the rank value and then uses a most significant bit, MSB, as a value of the bit pattern bit. In this manner, the bit pattern bit may be obtained using only low complexity hardware.

In some examples, the electronic device may further include a multiplexer operably coupled to the rank ROM, wherein during a second half of successive operations of the bit pattern generation process when $c \geq \lceil n/(2w) \rceil$, successive w-element sub-sets of the rank vector ($R_n$) may be obtained from decremental addresses in the rank ROM in a reverse order, where the offset from the start address of the rank ROM may be given by the multiplexer and may be derived from the counter value 'c' as $\lceil n/w \rceil - c - 1$). In this manner, the bit pattern vector may be read from the bit pattern ROM using only low complexity addressing hardware.

In some examples, the bit pattern vector ($b_{k,n}$) may be generated for a respective combination of 'k' and 'n' using the bank of (w) comparators that may be configured to compare each element of the rank vector ($R_n$) with 'n-k'. In some examples, each comparison of the element of the rank vector ($R_n$) with 'n-k' may be performed to determine whether the element of the rank vector ($R_n$) is greater than or equal to 'n-k'. In some examples, each comparison of the element of the rank vector ($R_n$) with 'n-k' may be performed to determine whether the element of the rank vector ($R_n$) is less than 'n-k' and the result may be passed through a NOT logic gate. In this manner, the bit pattern bit may be obtained using only low complexity hardware. In some examples, the bit pattern bit may be obtained by representing both a rank value and n-k using a two's complement fixed-point number representation, and the bit pattern generator circuit may perform a subtraction of n-k from the rank value and then passes a most significant bit, MSB, of a result through a NOT gate. In some examples, the electronic device may further include a bank of w multiplexers operably coupled to the rank ROM, wherein during a second half of successive operations of the bit pattern generation process the bank of w multiplexers may reverse the order of the w pattern bits $\{b_0, b_1, b_2, \ldots, b_{w-1}\}$. In this manner, the bit pattern bits may be generated in the correct order, using only low complexity hardware.

In some examples, elements of the rank vector ($R_n$), for a particular value of the length of the bit pattern 'n' may be stored in rank ROM in a native form or subtracted from 'n-1' and stored in rank ROM in a subtracted form. In some examples, each comparison to determine if a rank of the rank vector ($R_n$) may be less than 'k' may be performed by using a comparator to determine if the rank in subtracted form may be greater than or equal to 'n-k' and each comparison to determine if a rank of the rank vector ($R_n$) may be greater than or equal to than 'n-k' may be performed by using a comparator to determine if the rank in subtracted form is less than 'k'.

In some examples, the bank of w comparators may be used during both a first half of successive operations of the bit pattern generation process and a second half of successive operations of the bit pattern generation process. In some examples, the bank of w comparators may be implemented using twos complement subtractions.

In some examples, the electronic device may further include a multiplexer operably coupled to the bank of w comparators and configured to select between 'k' or 'n-k' as an input to the bank of w comparators; and a bank of w NOT logic gates operably coupled to an output of the bank of w comparators and configured to invert an output of the comparators bank of w comparators. In some examples, the electronic device may further include a bank of w multiplexers operably coupled to the rank ROM, wherein during a second half of successive operations of the bit pattern generation process the bank of w multiplexers may reverse the order of the w pattern bits $\{b_0, b_1, b_2, \ldots, b_{w-1}\}$. In this manner, the same low complexity hardware may be reduced in both the first and second halves of the bit pattern generation process.

In some examples, the bit pattern generator may be configured to exploit a nested, recursive and arithmetic property of the bit patterns vectors. In this manner, the ROM storage required to generate the bit pattern vector may be reduced relative to approaches that store the supported bit pattern vectors or the rank vectors in ROM. In some examples, a recursive circuit may be used to convert a value of n-k into an index $Q_n(n-k)$ of a bit having an (n-k)th highest bit reliability. In this manner, the index of the bit having the threshold bit reliability may be identified with a low complexity. In some examples, the recursive circuit may be further configured to unpack compressed information, in order to obtain the index $Q_n(n-k)$. In this manner, the decompression process may be configured to unpack only the single index $Q_n(n-k)$, rather than the entire index vector $Q_n$, reducing the associated complexity.

In some examples, the electronic device may further include an arithmetic circuit operably coupled to a recursive circuit and configured to use an arithmetic property that may be satisfied if a bit reliability metric can be obtained for each of the bits in the bit pattern vector based only on its index in the range '0' to 'n-1' to convert the index ($Q_n(n-k)$) of the bit having the (n-k)th rank into a bit reliability metric ($\beta(Q_n(n-k))$). In this manner, the threshold bit reliability may be obtained with a low complexity. In some examples, in a Polarization Weight, PW, sequence, the recursive property of the bit pattern vector ($b_{k,n}$) may be used to determine relationships between bits in the kernal information block. In some examples, the bit pattern generator circuit may determine: (i) in response to the recursive property of the bit pattern vector ($b_{k,n}$) being a frozen bit, that other selected bits will also be frozen bits; or (ii) in response to the recursive property of the bit pattern vector ($b_{k,n}$) being an information bit, that other selected bits will also be information bits. In some examples, in response to the bit pattern generator circuit determining that a relationship between bits in the kernal information block exists, the bit pattern generator circuit may be configured to disable at least one arithmetic circuit. In this manner, the arithmetic calculations of bit reliability may be skipped if the corresponding bits have already been determined as being frozen or information bits, reducing the power consumption of the bit pattern generator.

In some examples, the electronic device may further include a register operably coupled to the arithmetic circuit and configured to store the bit reliability metric ($\beta(Q_n(n-k))$) that may be used in the process of generating the bit pattern vector $b_{k,n}$. In this manner, the threshold bit reliability metric may be stored and used throughout the bit pattern generation process, eliminating the requirement to recalculate this threshold in each successive clock cycle.

In some examples, the electronic device may further include a multiplier and a bank of w-1 adders operably coupled to the counter, wherein, during each successive performance of the bit pattern generation process over a series ($t = \lceil n/w \rceil$) of clock cycles, the counter may be configured to increment a counter value, c, from 0 to t-1 to obtain bit indices $\{cw, cw+1, cw+2, \ldots, cw+w-1\}$ for successive w-element sub-sets ($b_0, b_1, b_2, \ldots, b_{w-1}$) of the bit pattern vector $b_{k,n}$.

In some examples, the electronic device may further include a bank of 'w' replicas of the arithmetic circuit that may be configured to compute a corresponding sequence of bit reliabilities, $\beta[cw], \beta[cw+1], \beta[cw+2], \ldots, \beta[cw+w-1]$. In some examples, the bank of (w) comparators may be configured to compare the computed corresponding bit reliabilities $\{\beta[cw], \beta[cw+1], \beta[cw+2], \ldots, \beta[cw+w-1]\}$ with the bit reliability metric ($\beta(Q_n(n-k))$), in order to obtain the corresponding w elements of the bit pattern vector $b_{k,n}$ by determining whether the corresponding bit reliabilities $\{\beta[cw], \beta[cw+1], \beta[cw+2], \ldots, \beta[cw+w-1]\}$ are greater than or equal to $\beta(Q_n(n-k))$. In this manner, the bit reliability metrics associated with w bit pattern bits may be compared with the threshold bit reliability metric in each clock cycle, with a low complexity.

In some examples, the electronic device may further include a bank of 'w' reverse modules operably coupled via the multiplier and the bank of w−1 adders to the counter, and configured to reverse an order of bits in a $\log_2(n)$-bit binary representation of each bit index, in order to produce reversed bit indices. In some examples, the electronic device may further include a bank of w comparators operably coupled bank of 'w' reverse modules and configured to compare either the bit indices or the reversed bit indices with either 'k' or 'n−k'. In some examples, in response to the polar coder implementing a shortening scheme, the bank of w comparators may be configured to set bit pattern bits $\{b_0, b_1, b_2, \ldots, b_{w-1}\}$ to the first binary value if the corresponding bit indices or reversed bit indices are less than 'k' and other bits to the complementary binary value. In some examples, the bank of w comparators may be configured to set bit pattern bits $\{b_0, b_1, b_2, \ldots, b_{w-1}\}$ to the first binary value if the corresponding bit indices or reversed bit indices are greater than or equal to 'n−k' in a puncturing scheme and other bits to the complementary binary value. In this manner, bit patterns for bit reversed shortening, bit reversed puncturing, natural shortening and natural puncturing may be generated.

In some examples, frozen bit insertion or frozen bit removal within the polar coding is performed by the electronic device and comprises at least two sub-processes and the bit pattern generator is configured to provide the successive sub-set of (w) bits from the bit pattern vector ($b_{k,n}$) in each successive $t=\lceil n/w \rceil$ clock cycle that spans a duration of a second sub-process that is preceded by a first sub-process that spans a series of zero or more clock cycles. In this manner, the first sub-process can initialise the second sub-process, such that it can select the K most reliable bits that are not frozen by rate-matching.

In some examples, a first logic circuit is arranged to provide during the first sub-process a reliability threshold, k, to an input of the bit pattern generator for use in the second sub-process. In this manner, it can be guaranteed that there will be K bits that are not frozen by rate matching among the bits selected by the second sub-process having reliabilities greater than the reliability threshold.

In some examples, the electronic device is configured to support at least two modes of operation, where a respective mode of operation is employed in response to whether a number, M, of encoded bits is less than a kernal block size, N. In this manner, the bits that are frozen by rate matching can be identified with consideration of the rate matching mode.

In some examples, the at least two modes of operation comprise at least two from: a repetition mode of operation when M is not less than N, a shortening mode of operation when M<N, a puncturing mode of operation when M<N. In this manner, repetition, shortening and puncturing modes of rate matching can be supported.

In some examples, the first sub-process has zero clock cycles when M is not less than N, and the second sub-process is performed with the threshold reliability number, k, set to a number of K bits that adopt the first binary value in a final output bit sequence. In this manner, support is provided for the repetition mode of operation, which does not freeze any bits.

In some examples, a controller operably coupled to a second counter is arranged to count a number of clock cycles under control of the controller in the first sub-process when M is less than N, and the first sub-process determines the rank threshold, k, that indicates a number of bits having a first binary value contained in an intermediate value for the bit pattern vector ($b_{k,n}$) output by the bit pattern generator circuit. In this manner, it can be guaranteed that there will be K bits that are not frozen by rate matching among these bits selected by the second sub-process having ranks greater than the rank threshold.

In some examples, a second logic circuit is configured to successively perform a binary flag generation process over the series ($t=\lceil n/w \rceil$) of clock cycles that comprise the second sub-process and configured to provide a successive sub-set of (w) binary flags in each successive $t=\lceil n/w \rceil$ clock cycle. In this manner, bits that are not frozen by rate matching can be identified.

In some examples, a binary flag is set in the binary flag generation process if a corresponding bit in the bit pattern vector ($b_{k,n}$) is not frozen by rate matching. In this manner, bits that are not frozen by rate matching can be signaled.

In some examples, a third logic circuit is configured to receive at least a first input from the second logic circuit and a second input from the bit pattern generator circuit wherein the third logic circuit is configured to provide an output of a first binary value when a bit in the subset of w bits of the intermediate bit pattern vector ($b_{k,n}$) from the bit pattern generator circuit adopts the first binary value and a corresponding flag from the plurality of binary flags from the second logic circuit is set, thereby adjusting a bit pattern vector ($b_{k,n}$) of the intermediate bit pattern based on the at least first and second inputs. In this manner, bits that are frozen by rate matching can be removed from the bit pattern.

In some examples, the first logic circuit is arranged to identify the reliability threshold, k, for use in the second sub-process by determining whether each uncoded bit is frozen by rate matching and the first logic circuit comprises a non-frozen bit counter arranged to count a number of uncoded bits that are not frozen by rate matching in order of decreasing reliability during the first sub-process, and once the count reaches the number of final value bits in a final output bit sequence, K, whereupon the rank of the $K^{th}$ most reliable unfrozen bit is determined as the rank threshold, k, and the first logic circuit provides the rank threshold k as an input to the bit pattern generator. In this manner, the bit pattern generator can identify the set of most reliable bits, in which there are guaranteed to be K bits that are not frozen by rate matching.

In some examples, the electronic device further comprises at least one of: a set of reversed sequence read only memories, ROMs, located in the first logic circuit configured to store sets of reversed sequences where each successive element of the reversed sequence indicates a position of each successive uncoded bit arranged in order of decreasing reliability; a set of deinterleaver ROMs located in the first logic circuit configured to store a set of deinterleaver patterns, where each element of the deinterleaver pattern indicates an interleaved position of a polar encoded bit during rate matching; a set of interleaved sequence ROMs located in the first logic circuit configured to store a set of interleaved sequences; a second counter (c1), incremented in successive clock cycles of the first sub-process, wherein successive addresses of a reversed sequence ROM and successive addresses of an interleaved sequence ROM, corresponding to a particular value of N are indexed; a rank ROM located in the bit pattern generator configured to store information sufficient to obtain a rank vector ($R_n$) for each supported length of the bit pattern, 'n'; a first set of functional logic, f1, located in the first logic circuit and configured to obtain a set of binary flags based on received successive sets of elements read from the set of reversed sequence ROMs and the set of interleaved sequence ROMs in each successive clock cycle; and an accumulator logic circuit located in the first logic circuit and configured to receive and count the set of binary flags up to a number, K, of uncoded bits that are not frozen by rate matching in a final output bit sequence, and the threshold reliability number, k, is set to complete the first sub-process. In this manner, the generation of the bit pattern can be completed several bits at a time, reducing the number of clock cycles required.

In some examples, the logic circuit is configured to identify a frozen bit as the complementary binary value in the bit pattern vector ($b_{k,n}$) and identify using the first binary value in the bit pattern vector ($b_{k,n}$) a bit that comprises one from a group of: an information bit, a cyclic redundancy check, CRC, bit, a parity-check frozen bit, a user equipment identifier, UE-ID, bit, a hash bit. In this manner, non-frozen bits can be treated separately from frozen-bits during the processes of interlacing and deinterlacing.

In some examples, the electronic device may include at least one of: a transmitter comprising an encoder configured to perform the bit pattern generation process, a receiver comprising a decoder configured to perform the bit pattern generation process.

In a second aspect, examples of the present invention describe an integrated circuit for an electronic device comprising the bit pattern generator and the counter according to the first aspect.

In a third aspect, examples of the present invention, a method of method of polar coding is described. The method includes successively performing a bit pattern generation process over a series ($t=\lceil n/w \rceil$) of clock cycles by a bit pattern generator; and counting a number of successive bit pattern generation sub-processes over the series ($t=\lceil n/w \rceil$) of clock cycles. The method further includes providing a successive sub-set of (w) bits from a bit pattern vector ($b_{k,n}$) in each successive $t=\lceil n/w \rceil$ clock cycle; where the bit pattern vector comprises 'n' bits, of which 'k' bits adopt a first binary value and n–k bits adopt a complementary binary value.

In a fourth aspect, examples of the present invention describe a non-transitory tangible computer program product comprising executable code stored therein for bit pattern generation according to the third aspect.

Although examples of the invention are described with reference to an electronic device and at least one integrated circuit implementation, it is envisaged that in other examples, the invention may be applied in other implementations and in other applications, such as a wireless communication having a transmitter with a polar encoder and/or a receiver with a polar decoder. For example, the circuits and concepts herein described may be composed as a hardware implementation within an Application Specific Integrated Circuit, an Application Specific Instruction Set Processor, an Application Specific Standard Product, a Field Programmable Gate Array, a General-Purpose Graphical Processing Unit, System on Chip, Configurable Processor, for example. Similarly, it is envisaged that in other examples, a software implementation may be composed within a Central Processing Unit, a Digital Signal Processor or a microcontroller, for example. Besides wireless communication transmitters and receivers, the invention may be composed into a wireless communication transceiver, or a communication device for other communication channels, such as optical, wired or ultrasonic channels. Furthermore, the invention may be composed into a storage device, in order to provide FEC for data recovered from optical, magnetic, quantum or solid-state media, for example.

Some examples of the present invention are described with reference to the New Radio (NR) standard, which is presently being defined by the 3rd Generation Partnership Project (3GPP) as a candidate for 5th Generation (5G) mobile communication. Presently, polar encoding and decoding has been selected to provide FEC in the uplink and downlink control channels of the enhanced Mobile Broad-Band (eMBB) applications of NR, as well as in the Physical Broadcast Channel (PBCH). Polar encoding and decoding has also been identified as candidates to provide FEC for the uplink and downlink data and control channels of the Ultra Reliable Low Latency Communication (URLLC) and massive Machine Type Communication (mMTC) applications of NR. Alternatively, some examples of the invention are described without reference to a particular standardised application. More broadly, the invention may be applied in any future communication standards that select polar encoding and decoding to provide FEC. Furthermore, the invention may be applied in non-standardised communication applications, which may use polar encoding and decoding to provide FEC for communication over wireless, wired, optical, ultrasonic or other communication channels. Likewise, the invention may be applied in storage applications, which use polar encoding and decoding to provide FEC in optical, magnetic, quantum, solid state and other storage media.

In some examples, the circuits and functions herein described may be implemented using discrete components and circuits, whereas in other examples the operations may be performed in a signal processor, for example in an integrated circuit.

Because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

DETAILED DESCRIPTION OF FIGURES

Referring now to FIG. 1, a top-level schematic of a communication unit 116 that includes a polar encoder and polar decoder is illustrated, adapted according to examples of the invention. In this example of a communication unit 116, a skilled artisan will appreciate that a number of other components and circuits (such as frequency generation circuits, controllers, amplifiers, filters, etc.) are not shown for simplicity purposes only. In other examples, it is envisaged that the associated circuitry in the communication unit 116 may take the form of an integrated circuit comprising block conditioning in a polar encoder or polar decoder as well as, for example, for use in a storage unit or any electronic device that is designed to use polar encoding or polar decoding. In other examples, it is envisaged that the communication unit 116 may take the form of software running on a general-purpose computation processor.

A polar encoder comprises three successive components, namely information block conditioning 101, the polar encoder kernal 102 and encoded block conditioning 103. These components are discussed in the following paragraphs. In order to provide context to the present discussion, FIG. 1 illustrates the communication or storage channel 108, as well as the corresponding components of the polar decoder, namely the information block conditioning 112, the polar decoder kernal 111 and the encoded block conditioning 110, although these are operated in the reverse order.

As will be discussed in the following paragraphs, the polar encoder operates on the basis of an information block 104, kernal information block 105, kernal encoded block 106 and encoded block 107. Correspondingly, the polar decoder operates on the basis of a recovered information block 115, recovered kernal information block 114, soft kernal encoded block 113 and soft encoded block 109, although these are processed in the reverse order.

Therefore, hereinafter throughout the description, claims and drawings, the expression 'polar coding' is intended to encompass polar encoding and/or polar decoding, unless specifically referenced otherwise.

In a context of a polar encoder, the input to the information block conditioning component 101 may be referred to as an information block 104, having a block size of K. More specifically, this information block is a row vector $a=[a_i]_{i=0}^{K-1}$ comprising K information bits, where $a_i \in \{0,1\}$. The information block conditioning component 101 interlaces the K information bits with N−K redundant bits, which may be frozen bits [1], Cyclical Redundancy Check (CRC) bits [2], Parity Check (PC)-frozen bits [3], User Equipment Identification (UE-ID) bits [4], or hash bits [5], for example.

Here, frozen bits may always adopt a logic value of '0', while CRC or PC-frozen bits or hash bits may adopt values that are obtained as functions of the information bits, or of redundant bits that have already been interlaced earlier in the process. The information block conditioning component 101 generates redundant bits and interlaces them into positions that are identified by a prescribed method, which is also known to the polar decoder. The information block conditioning component 101 may also include an interleaving operation, which may implement a bit-reversal permutation [1] for example. The output of the information block conditioning component 101 may be referred to as a kernal information block 105, having a block size of N. More specifically, this kernal information block 105 is a row vector $$u = [u_j]_{j=0}^{N-1}$$

comprising N Kernal information bits, where $u_j \in \{0,1\}$. Here, the information block conditioning must be completed such that N is a power of 2 that is greater than K, in order to provide compatibility with the polar encoder kernal, which operates on the basis of a generator matrix having dimensions that are a power of 2, as will be discussed below. The input to the polar encoder kernal 102 is a kernal information block u 105 and the output of the polar encoder kernal 102 may be referred to as a kernel encoded block 106, having a block size that matches the kernal block size N. More specifically, this kernal encoded block 106 is a row vector: $x=[x_j]_{j=0}^{N-1}$ comprising N kernal encoded bits, where $x_j \in \{0,1\}$. Here, the kernal encoded block 106 is obtained according to the modulo-2 matrix multiplication $x=uF^{\otimes n}$, where the modulo-2 sum of two bit values may be obtained as their XOR. Here, the generator matrix $F^{\otimes n}$ is given by the [n=log 2(N)]th Kronecker power of the kernal matrix:

$$F = \begin{bmatrix} 1 & 0 \\ 1 & 1 \end{bmatrix}.$$

Note that successive Kronecker powers of the kernal matrix may be obtained recursively, where each power $F^{\otimes n}$ is obtained by replacing each logic '1' in the previous power $F^{\otimes(n-1)}$ with the kernal matrix and by replacing each logic '0' with a 2×2 zero matrix. Accordingly, the $n^{th}$ Kronecker power $F^{\otimes n}$ of the kernal matrix has dimensions of $2^n \times 2^n$. For example, $$F^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}, \quad F^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

Here, u=[1011] gives $x=uF^{2372}$=[1101] and u=[11001001] gives $x=uF^{\otimes 3}$=[00110111].

A skilled artisan will appreciate that the level of integration of circuits or components may be, in some instances, implementation-dependent. Furthermore, it is envisaged in some examples that a signal processor may be included in a communication unit 116 and be adapted to implement the encoder and decoder functionality. Alternatively, a single processor may be used to implement a processing of both transmit and receive signals, as shown in FIG. 1, as well as some or all of the baseband/digital signal processing functions. Clearly, the various components, such as the described polar encoder, within a wireless or wired communication unit 116 can be realized in discrete or integrated component form, with an ultimate structure therefore being an application-specific or design selection.

In this example, the input to the encoded block conditioning component 103 of the polar encoder is a kernal encoded block x 106 and its output may be referred to as an encoded block 107, having a block size of M. More specifically, this encoded block is a row vector comprising M encoded bits $b=[b_k]_{k=0}^{M-1}$, where $b_k \in \{0,1\}$.

Here, the resultant polar coding rate is given by R=K/M, where the encoded block conditioning 103 must be completed such that 'M' is greater than 'K'. The encoded block conditioning component 103 may use various techniques to generate the 'M' encoded bits in the encoded block b 107, where 'M' may be higher or lower than 'N'. More specifically, repetition [6] may be used to repeat some of the 'N' bits in the kernel encoded block 'x', while shortening or puncturing techniques [6] may be used to remove some of the 'N' bits in the kernel encoded block 'x'. Note that shortening removes bits that are guaranteed to have logic values of '0', while puncturing removes bits that may have either of logic '0' or '1' values. The encoded block conditioning component may also include an interleaving operation. Following polar encoding, the encoded block 'b' 107 may be provided to a modulator, which transmits it over a communication channel 108.

Figure 2:
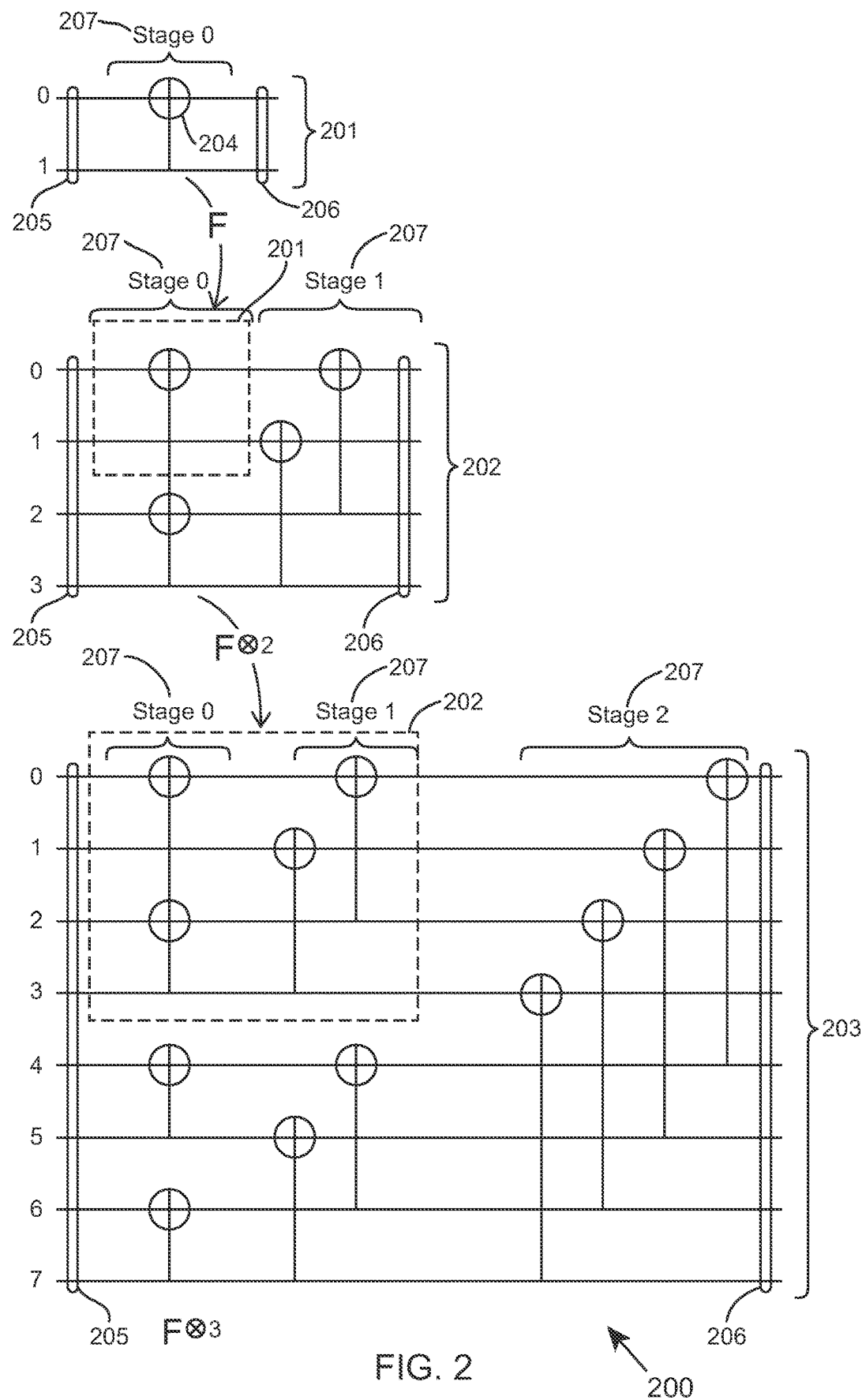
FIG. 2 illustrates an example graphical representation of the generator matrices F, $F^{\otimes 2}$ and $F^{\otimes 3}$, according to example embodiments of the invention.
Figure 3:
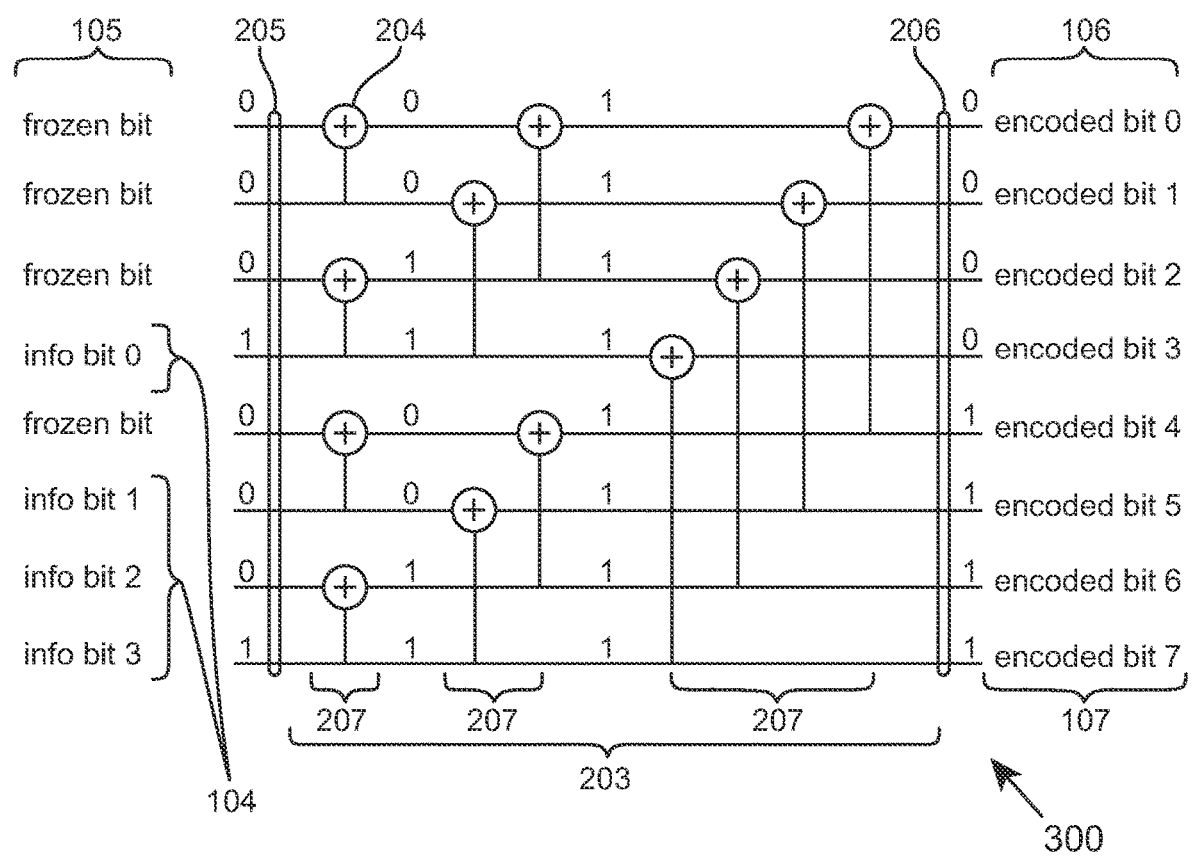
FIG. 3 illustrates an example polar encoding process, using the graphical representation of the generator matrix $F^{\otimes 3}$, illustrating the case where a particular frozen bit pattern is used to convert the K=4 information bits a=[1001] into the M=8 encoded bits b=[00001111], according to example embodiments of the invention.

Referring now to FIG. 2 and FIG. 3 an example polar encoding process, using an extension of the graphical representation 300 of the generator matrix $F^{\otimes 3}$ 203, illustrates the example where a particular frozen bit pattern is used to convert the K=4 information bits a=[1001] 104 into the M=8 encoded bits b=[00001111] 107. More specifically, information block conditioning 101 is used to convert the K=4 information bits a=[1001] 104 into the N=8 kernal information bits u=[00010001] 105. These are then converted into the N=8 kernal encoded bits x=[00001111] 106 by the polar encoder kernal 102 using the polar code graph 203. Here, the input paths can be traced through the various XOR operations to identify the output. Finally, encoded block conditioning 103 preserves all kernal encoded bits, to provide the M=8 encoded bits b=[00001111] 107.

In the receiver, the demodulator's role is to recover information pertaining to the encoded block. However, the demodulator is typically unable to obtain absolute confidence about the value of the M bits in the encoded block 107, owing to the random nature of the noise in the communication channel 108. The demodulator may express its confidence about the values of the bits in the encoded block 107 by generating a soft encoded block 109, having a block size of M. More specifically, this soft encoded block 109 is a row vector comprising M encoded soft bits $\tilde{b}=[\tilde{b_k}]_{k=0}^{M-1}$. Each soft bit may be represented in the form of a Logarithmic Likelihood Ratio (LLR), $$\tilde{b_k} = \ln\left[\frac{Pr(b_k = 0)}{Pr(b_k = 1)}\right],$$

where $Pr(b_k='0')$ and $Pr(b_k='1')$ are probabilities that sum to '1'.

Here, a positive LLR $\tilde{b_k}$ indicates that the demodulator has greater confidence that the corresponding bit $b_k$ has a value of '0', while a negative LLR indicates greater confidence in the bit value '1'. The magnitude of the LLR expresses how much confidence, where an infinite magnitude corresponds to absolute confidence in this bit value, while a magnitude of '0' indicates that the demodulator has no information about whether the bit value of '0' or '1' is more likely.

In an alternative approach, each soft bit may be represented by a pair of Logarithmic Likelihoods (LLs):

$$\breve{b}_k(0)=\ln[Pr(b_k=0)]$$

$$\breve{b}_k(1)=\ln[Pr(b_k=1)]$$

A polar decoder comprises three successive components, namely encoded block conditioning 110, the polar decoder kernal 111 and information block conditioning 112, as shown in FIG. 1. These components are discussed in the following paragraphs.

The input to the encoded block conditioning component 110 of the polar decoder is a soft encoded block $\tilde{b}$ 109 and its output may be referred to as a soft kernal encoded block 113, having a block size of N. More specifically, this soft kernal encoded block 113 is a row vector comprising 'N' kernal encoded LLRs $\tilde{x}=[\tilde{x}_j]_{j=0}^{N-1}$. In order to convert the M encoded LLRs into 'N' kernal encoded LLRs, infinite-valued LLRs may be interlaced with the soft encoded block 109, to occupy the positions within the soft kernal encoded block that correspond to the '0'-valued kernal encoded bits that were removed by shortening in the polar encoder. Likewise, '0'-valued LLRs may be interlaced with the soft encoded block 109, to occupy the positions where kernal encoded bits were removed by puncturing. In the case of repetition, the LLRs that correspond to replicas of a particular kernal encoded bit may be summed and placed in the corresponding position within the soft kernal encoded block 109. A corresponding deinterleaving operation may also be performed, if interleaving was employed within the encoded block conditioning component 103 of the polar encoder.

The input to the polar decoder kernal 111 is a soft kernal encoded block $\tilde{x}$ 113 and its output may be referred to as a recovered kernal information block 114, having a block size of 'N'. More specifically, this recovered kernal information block 114 is a row vector comprising 'N' recovered kernal information bits $\hat{u}=[\hat{u}_j]_{j=0}^{N-1}$, where $\hat{u}_j \in \{0,1\}$. In some examples, the polar decoder kernal 111 may operate using various different algorithms, including Successive Cancellation (SC) decoding [1] and Successive Cancellation List (SCL) decoding [7].

The input to the information block conditioning component 112 of the polar decoder is a recovered kernal information block 114 and its output may be referred to as a recovered information block 115, having a block size of 'K'. More specifically, this recovered information block 115 is a row vector $\hat{a}=[\hat{a}_i]_{i=0}^{K-1}$ comprising 'K' recovered information bits, where $\hat{a}_i \in \{0,1\}$. The recovered information block may be obtained by removing all redundant bits from the recovered kernal information block $\hat{u}$ 114. A corresponding deinterleaving operation may also be performed, if interleaving was employed within the information block conditioning component 101 of the polar encoder.

Proposed Block Conditioning Units

As shown in the top-level schematic of FIG. 1, a polar encoder and polar decoder pair includes the four block conditioning modules 101, 103, 110, 112.

The information block conditioning module 101 of the polar encoder and the encoded block conditioning module 110 of the decoder may both convert a shorter input into a longer output. More specifically, the input to the information block conditioning module 101 of the polar encoder comprises K information bits 104. In some examples, the K information bits 104 may be interlaced with N−K redundant bits, in order to produce N>K kernal information bits 105. Likewise, the input to the encoded block conditioning module 110 of the polar decoder comprises M soft encoded LLRs 109. In some examples, the M soft encoded LLRs 109 may be interlaced with N-M punctured or shortened LLRs, in order to produce N>M soft kernal encoded LLRs 113.

In accordance with example embodiments of the invention, an interlacer (for example as illustrated in, and described with reference to FIG. 4 and FIG. 5) has been designed to implement these interlacing operations that are performed in the information block conditioning module 101 of the polar encoder and the encoded block conditioning module 110 of the decoder.

By contrast, the encoded block conditioning circuit 103 of the polar encoder and the information block conditioning module 112 of the decoder both convert a longer input into a shorter output. More specifically, the input to the encoded block conditioning circuit 103 of the polar encoder comprises N kernal encoded bits 106. In some examples, N-M of these bits may be punctured or shortened, in order to produce M<N encoded bits 107. Likewise, the input to the information block conditioning module 112 of the polar decoder comprises N recovered kernal information bits 114. In some examples, N−K of these bits may be redundant bits and may thus be removed, in order to produce K<N recovered information bits 115.

In accordance with examples of the invention the block conditioning circuits operate on the basis of bit patterns. More specifically, an information bit pattern is used in the information block conditioning modules of the polar encoder and decoder, in order to specify how the corresponding interlacing and deinterlacing operations may be performed. Likewise, an encoded bit pattern is used in the encoded block conditioning modules of the polar encoder and decoder, in order to specify how the corresponding deinterlacing and interlacing operations may be performed. In some examples, bit pattern generators 3403 (as illustrated in FIGS. 4, 5, 7, 10, 11, 12 and 13) may be employed by the interlacer to control the interlacing operations.

Interlacer

Figure 4:
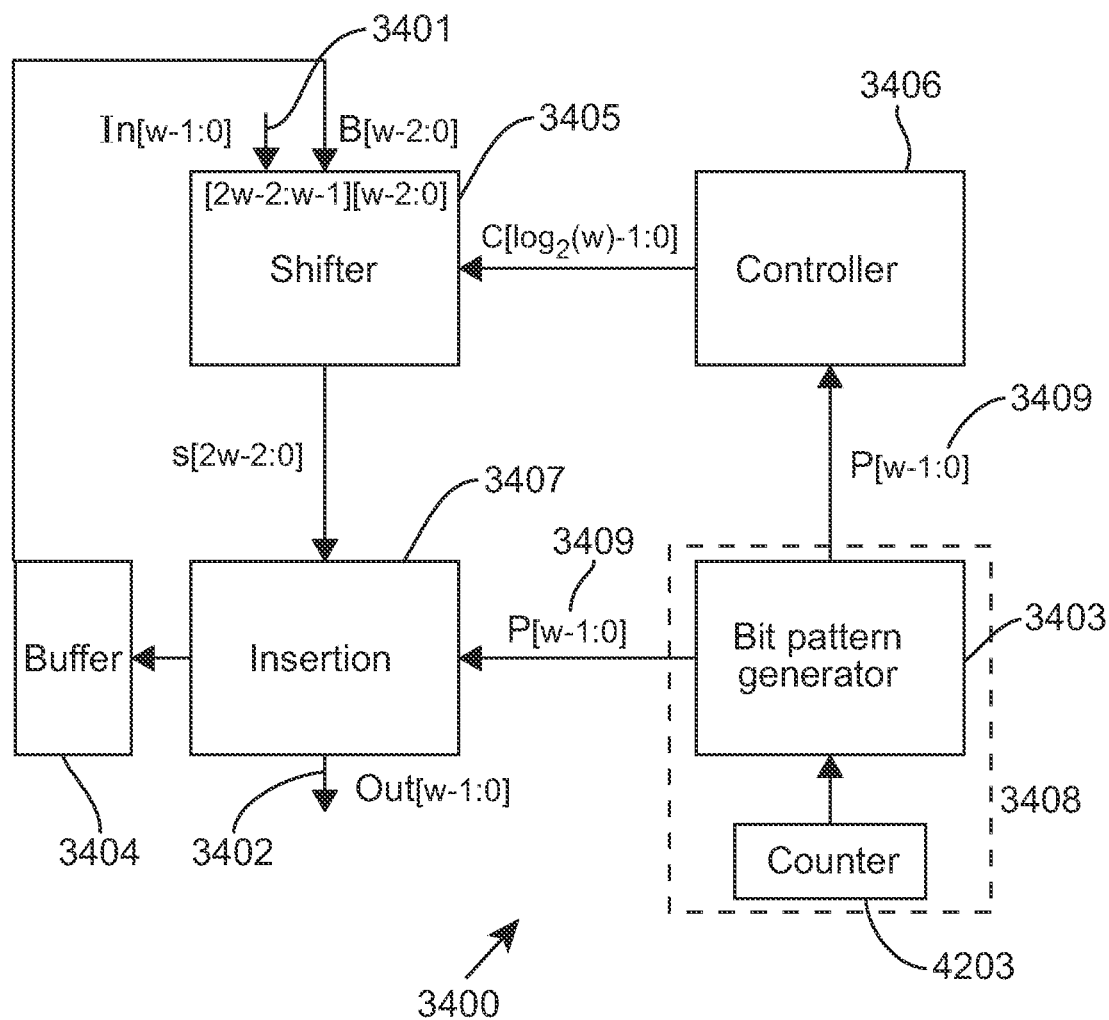
FIG. 4 illustrates an example block diagram of an interlacer architecture, according to some example embodiments of the invention.

Referring now to FIG. 4, an example block diagram of an interlacer 3400 is illustrated, according to some example embodiments of the invention. In some examples, the interlacer 3400 may be capable of flexibly converting k-element input vectors into corresponding n-element output vectors, where k and n may vary from use to use. More specifically, the interlacer 3400 may perform interlacing for each input vector according to a bit pattern, which may be selected from a predefined set of supported bit patterns, having various combinations of k and n. The interlacer 3400 may be used to implement a flexible information block conditioning circuit, such as information block conditioning circuit 101 of FIG. 1, for a polar encoder. In this case, the flexible information block conditioning circuit 101 may be capable of converting one k=K-bit information block 104 into the corresponding n=N-bit kernal information block 105 at a time, where the block sizes K and N may vary from block-to-block. Additionally, the interlacer 3400 may be used to implement a flexible encoded block conditioning circuit 110 for a polar decoder. In this case, the flexible encoded block conditioning circuit 110 may be capable of converting one k=M-LLR soft encoded block 109 into the corresponding n=N-LLR soft kernal encoded block 113 at a time, where the block sizes M and N may vary from block-to-block. Note than in both the polar encoder and polar decoder examples, the kernal block size N is a power of two.

Figure 5:
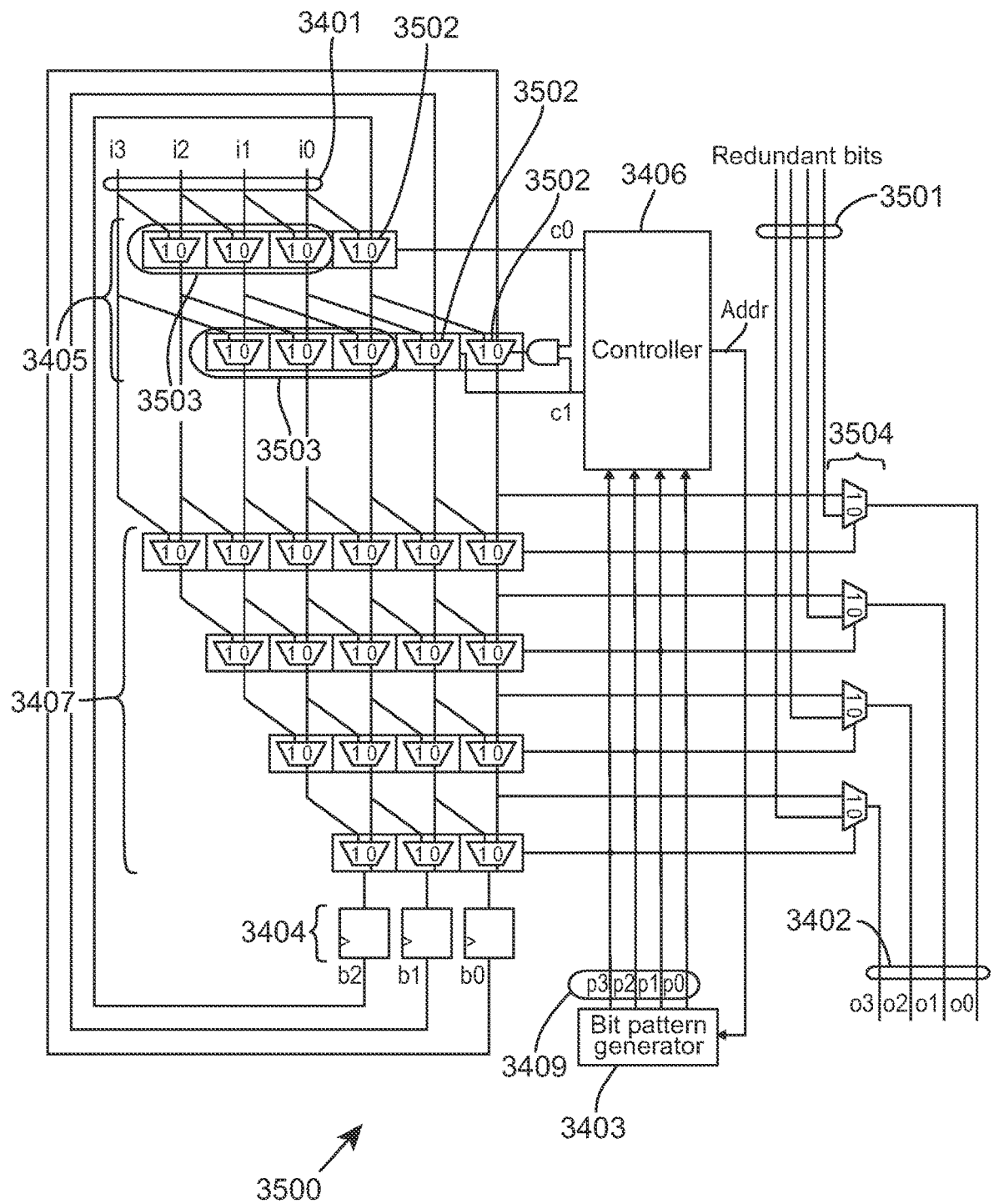
FIG. 5 illustrates a more detailed example of an interlacer architecture for the case of w=4, according to some example embodiments of the invention.

In some examples, the interlacing process is completed over a series of t=⌈n/w⌉ steps, where w is a power of two that is referred to as the width of the proposed interlacer's input port 3401 and output port 3402 (with the input port 3401 and output port 3402 of FIG. 4 carrying multiple signals as illustrated in FIG. 5). This quantifies the number of elements that the respective ports may consume from the input vector or generate for the output vector in each step. Here, the output port 3402 generates w elements for the output vector in every step, while the input port 3401 only consumes w elements from the input vector in ⌈k/w⌉≤t of the steps, which may be distributed across the t steps, as detailed below.

The first in each set of w elements of the input and output vectors are mapped to the right-most of the w elements of the input port 3401 and output port 3402, with successive elements of the vectors mapped to successive elements of the input port 3401 and output port 3402 from right to left. Depending on if and how pipelining is applied, each step of the interlacing process may correspond to one clock cycle in a hardware implementation. Here, each LLR may be represented using the two's complement number representation having a same bit-width as the LLR input to a polar decoder kernal, such as the polar decoder kernal 111 of FIG. 1. It is noteworthy that the proposed approach processes w pattern bits in each step, which is in contrast to the block conditioning modules of known designs [14, 15], which are only capable of processing a single pattern bit in each step.

The interlacer 3400 also comprises bit pattern generator 3403, buffer 3404, shifter 3405, controller 3406 and insertion 3407 circuits (or logic or software-based operations). In some examples, each of the w bits 3409 output by the bit pattern generator 3403 in a particular step of the interlacing process corresponds to the element in the corresponding position among the w elements generated by the output of the proposed interlacer in that step. If the bit has a value '1', then the corresponding output element is supplied by the next element provided by the input of the interlacer 3400, as will be detailed below. By contrast, if the bit has the value '0', then the corresponding output element 3402 is provided by an interlaced element (such as interlaced element 3501 in FIG. 5). It is noteworthy that, in the case, where: n<w, the bit pattern generator 3403 may append w-n dummy bits to the end of the bit pattern, in order to increase its length to w.

In the case of the information block conditioning circuit 101 of the polar encoder, the interlaced element may be a frozen bit having the value '0', a cyclic redundancy check (CRC) bit, a parity check (PC)-frozen bit, a user equipment identifier (UE-ID) bit or a hash bit, for example. In the case of the encoded block conditioning circuit 110 of the polar decoder, the interlaced element may be a punctured LLR having the value '0', or a shortened LLR having a maximum positive value supported by the two's complement fixed-point number representation [6], for example. Note that in some applications, more than one type of interlaced element may be required, where the information bits may be interlaced with both frozen bits and CRC bits, for example. In this case, separate bit patterns may be used for each type of interlaced element. Alternatively, the bit pattern may use $\lceil \log_2(z) \rceil$ bits for each element of the bit pattern, where the combination of the $\log_2(z)$ bits may identify which one of z different types of element is used. For example, the bit pairings 10, 01 and 11 may be used to represent the z=3 options of frozen bit, CRC bit and information bit, respectively. In this case, a decoder circuit may be used to extract the separate bit patterns for each type of interlaced element.

In each step i∈[0, t−1] of the interlacing process, the controller 3406 may count the number $P_i$ of 1-valued bits among the w bits 3409 provided by the bit pattern generator 3403, as described herein. This number of elements is compiled for the output of the proposed interlacing process, by drawing upon two sources of elements: firstly, any elements that reside within the (w−1)-element buffer 3404 and secondly, the input port 3401 of the interlacer 3400. The controller 3406 keeps track of the number $R_i$∈[0, w−1] of valid elements that are stored in the buffer 3404 at the beginning of each step of the interlacing process, where the buffer 3404 is initially empty at the start of the interlacing process, giving $R_0$=0. In any steps where the number of valid elements in the buffer $R_i$ is less than the number required $P_i$, the controller 3406 may cause w elements to be drawn from the input 3401, on an on-demand basis.

Referring now to FIG. 5, a more detailed example of an interlacer 3500 for the case of w=4 is illustrated, according to some example embodiments of the invention. As exemplified in FIG. 5, a bit-shifter circuit 3405 is used to combine elements drawn from the w-element input port 3401 and the (w−1)-element buffer 3404, producing a (2w−1)-element output containing at least $P_i$ valid elements. In cases where $R_i$<$P_i$, the w-element input port 3401 of the proposed interlacer is appended to the left of the elements from the buffer 3404. However, only $R_i$∈[0, w−1] of the w−1 elements from the buffer 3404 will be valid, so the controller 3406 directs a bit-shifter circuit 3405 to shift the w-element input port 3401 of the proposed interlacer 3500 by $C_i$=w−1−$R_i$ positions to the right, before multiplexing it with the $R_i$ elements from the buffer 3404. The bit-shifter circuit 3405 may be implemented using $\log_2(w)$ rows of multiplexers, where each row 3503 uses w−1 multiplexers to implement a different power-of-two shift. As shown in FIG. 5, the control signal for each multiplexer row 3503 may be obtained from the corresponding bit of the binary representation of $C_i$, where the Most Significant Bit (MSB) drives the row implementing the largest power-of-two shift and the Least Significant Bit (LSB) drives the row implementing the shift of one position. In some examples, it is noted that the rows may be permuted in any order. A further w−1 multiplexers 3502 are required to multiplex the shifted input with the contents of the buffer 3404, where the right-most $R_i$ elements are selected from the buffer 3404 and the remaining elements are selected from the output of the bit-shifter circuit 3405. It is envisaged that in an alternative architecture, the further w−1 multiplexers may be arranged within the same rows of the bit-shifter circuit 3405, reducing the critical path length of the interlacer 3500. In cases where: $R_i < P_i$, the above-described approach results in valid elements for the right-most $R_i$+w of the 2w−1 outputs of the bit-shifter circuit 3405. By contrast, when $R_i \geq P_i$, no input is taken from the input of the interlacer 3500 and the bit-shifter circuit 3405 is disabled. This results in the $R_i$ valid elements from the buffer 3404 providing the right-most $R_i$ of the 2w−1 outputs of the bit-shifter circuit 3405.

The (2w−1)-element output of the bit-shifter circuit 3405 is provided to the insertion circuit 3407, which extracts $P_i$ elements in positions dictated by the bit pattern and places all remaining elements into the buffer 3404, ready for use in the next step of the interlacing process. The insertion circuit 3407 comprises w rows of multiplexers, where the top-most row comprises 2w−2 multiplexers and each successive row below it contains one fewer multiplexer than the last. In this manner, each row of multiplexers forms a shifting circuit, which is controlled by the value of the corresponding bit from the bit pattern. More specifically, if the corresponding bit from the bit pattern is a '1', then the right most element at the input to the row is extracted for the output of the interlacer 3500 and all other elements at the input to the row are shifted to the right by one position, as shown in FIG. 5. The bits of the bit pattern are also used to control a set of w multiplexers 3504, which multiplex the elements extracted from the insertion circuit 3407 with the corresponding interlaced elements 3501, which may be redundant bits in the case of the information block conditioning module 101 of the polar encoder or punctured or shortened LLRs in the case of the encoded block conditioning module 110 of the polar decoder. In cases where different interlaced elements 3501 have different values, replicas of the interlacer 3500 may be operated on the basis of the complementary bit patterns described above. The outputs of these interlacers may then be multiplexed together, using the set of w multiplexers 3504 described above.

Following a completion of each step of the interlacing process, the (w−1) elements output by the bottom row of the insertion circuit 3407 are stored in the buffer 3404. In steps where $R_i < P_i$, the number of these elements that are valid will be given by $R_{i+1} = R_i + w - P_i$, while $R_{i+1} = R_i - P_i$ of the elements will be valid in steps where $R_i \geq P_i$. The buffer 3404 then makes these valid elements available to the next step of the interlacing process, as described above.

The total number of multiplexers required for the interlacer 3500 is given by $3w^2/2 + w \log_2(w) + w/2 \log_2(w) - 1$. The critical path comprises $w + \log_2(w)$ multiplexers, in the case where all multiplexers of the bit-shifting circuit 3405 are accommodated within the same $\log_2(w)$ rows.

Figure 6:
FIG. 6 illustrates an example table to operate an interlacer, where: w=4, for the case where the k=9 input elements [9, 8, 7, 6, 5, 4, 3, 2, 1] are interlaced from right-to-left with 0-valued interlacing elements, according to the n=16-bit pattern [1100011010110101], according to some example embodiments of the invention.

FIG. 6 illustrates an example table to operate interlacer 3400 or 3500 where w=4, for the case where the k=9 input elements [9, 8, 7, 6, 5, 4, 3, 2, 1] are interlaced from right-to-left with '0'-valued interlacing elements, according to the n=16-bit pattern [1100011010110101]. In step '0', $P_0 = 2$ elements are required, but the buffer (for example buffer 3404 of FIG. 4 or FIG. 5) contains $R_0 = 0$ valid elements, so w=4 elements are consumed from the input port 3401. Of the w=4 elements, $P_0 = 2$ contribute to the output in positions dictated by the bit pattern, with the remaining $R_1 = 2$ elements being stored in the buffer 3404. In step '1', $P_1 = 3$ elements are required, but the buffer 3404 contains only $R_1 = 2$ valid elements, so w=4 elements are consumed from the input port 3401. Of the $R_1 + w = 6$ elements, $P_1 = 3$ contribute to the output in positions dictated by the bit pattern, with the remaining $R_2 = 3$ elements being stored in the buffer 3404. In step '2', $P_2 = 2$ elements are required and the buffer 3404 contains $R_2 = 3$ valid elements, so no elements are consumed from the input port 3401. Of the $R_2 = 3$ elements, $P_2 = 2$ contribute to the output in positions dictated by the bit pattern, with the remaining $R_3 = 1$ element being stored in the buffer 3404. In step '3', $P_3 = 2$ elements are required, but the buffer 3404 contains only $R_3 = 1$ valid element, so the remaining element is consumed from the input 3401, but padded with zeros in order to make up a width of w=4. Both of the $R_3 + 1 = 2$ elements contribute to the output in positions dictated by the bit pattern.

Bit Pattern Generator

In examples of the invention, a number of alternative designs for the bit pattern generator 3403 are proposed herein, any of which may be used to generate the information bit pattern used by the interlacer 3400 or 3500 in order to implement the information block conditioning circuit 101 of the polar encoder. Furthermore, these example designs may be used to generate the encoded bit pattern used by the interlacers 3400, 3500 in order to implement the encoded block conditioning circuit 110 of a polar decoder.

The following sections propose alternative bit pattern generator designs that may exploit various different combinations of the bit pattern properties.

Figure 7:
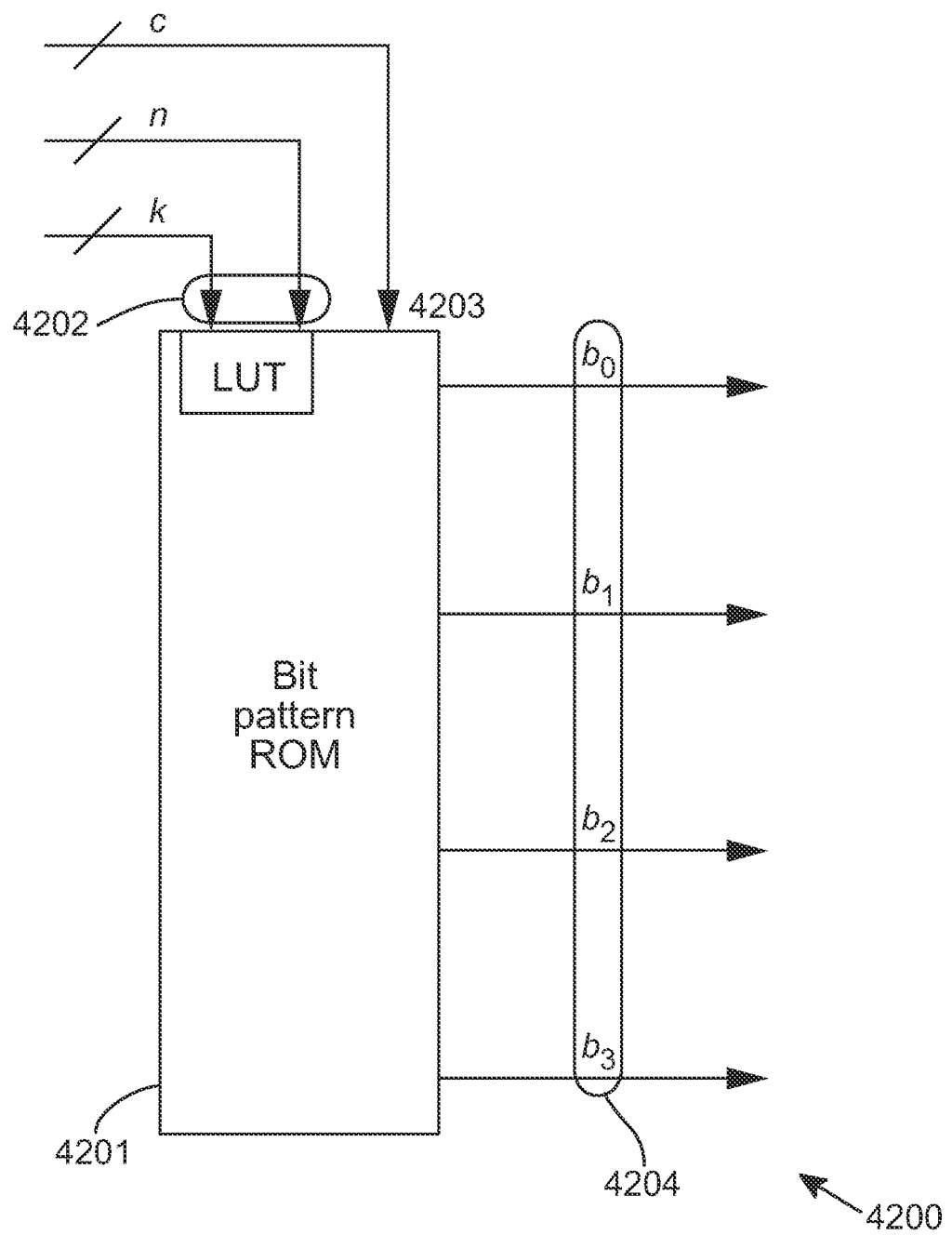
FIG. 7 illustrates a naive bit pattern generator, for the case where w=4, according to some example embodiments of the invention.

1) Naive Bit Pattern Generator:

Referring now to FIG. 7, a naive bit pattern generator 4200, for the case where w=4, is illustrated according to some example embodiments of the invention. In a naive implementation, the bit pattern generator 4200 may be implemented using a bit pattern Read Only Memory (ROM) 4201, which may store a set of supported bit pattern vectors $b_{k,n}$, each corresponding to a particular combination of input and output vector lengths k and n. In some examples, an off-line pre-computation process may be used to generate this set of supported bit pattern vectors $b_{k,n}$ for all supported bit patterns, which may be read from the bit pattern ROM 4201 as required during the on-line block conditioning process.

Figure 8:
FIG. 8 illustrates an example table of contents of a bit pattern ROM, when using a Polarization Weight (PW) bit pattern construction of [8] for all combinations of n∈{2, 4, 8, 16} and k∈{1, 2, 3, . . . , n−1}, according to some example embodiments of the invention.

Referring now to FIG. 8, an example table of contents 3700 of the bit pattern ROM, when using the Polarization Weight (PW) bit pattern construction of [8] for all combinations of $n \in \{2, 4, 8, 16\}$ and $k \in \{1, 2, 3, \ldots, n-1\}$, is illustrated according to some example embodiments of the invention. In the example table of FIG. 8, a set of information bit pattern vectors $b_{k,n}$ is generated for all combinations of $n \in \{2, 4, 8, 16\}$ and $k \in \{1, 2, 3, \ldots, n-1\}$. Here, a '1'-valued element in the information bit pattern vector $b_{k,n}$ indicates that the corresponding bit in the kernal information block, say kernal information block 105 of FIG. 1, should be an information bit. Meanwhile, a '0'-valued element in the information bit pattern vector $b_{k,n}$ corresponds to a redundant bit, which may be a frozen bit, CRC bit, PC-frozen bit, UE-ID bit, or hash bit, for example. Note that in alternative arrangements, a '1'-valued element in the information bit pattern vector $b_{k,n}$ indicates that the corresponding bit in the kernal information block should be a non-frozen bit, which may be an information bit, CRC bit, PC-frozen bit or UE-ID bit or hash bit, for example. Meanwhile, a '0'-valued element in the information bit pattern vector $b_{k,n}$ may correspond to a frozen bit. Alternatively, separate bit pattern vectors may be used to indicate whether each bit belongs to each type of bit.

Referring back to FIG. 7, in order to support all combinations of $n \in \{2, 4, 8, \ldots, n_{max}\}$ and $k \in \{1, 2, 3, \ldots, n-1\}$, the total capacity requirement of the bit pattern ROM 4201 is given by $\Sigma_{n \in \{2, 4, 8, \ldots, n_{max}\}}(n^2-n)$, which corresponds to 1.33 Mbit in the case where $n_{max}=1024$. The bit pattern ROM 4201 has a width of w bits and each bit pattern vector $b_{k,n}$ is stored across $\lceil n/w \rceil$ consecutive addresses, where n is the output vector length supported by the bit pattern vector $b_{k,n}$. In some examples, in cases where: n<w, the bit pattern vector $b_{k,n}$ may be appended with w-n dummy bits, such that it occupies the width of a single address in the bit pattern ROM 4201. As shown in FIG. 7, k and n may be used to index a look-up table 4202, in order to identify the start address of each particular bit pattern vector $b_{k,n}$. During each of the $t=\lceil n/w \rceil$ successive steps of the block conditioning process, a counter 4203 c may be incremented from 0 to t–1 and used as an offset from the start address of the bit pattern ROM 4201, in order to read successive w-element sub-sets $\{b_0, b_1, b_2, \ldots, b_{w-1}\}$ 4204 of the bit pattern vector $b_{k,n}$. In examples of the invention, the counter 4203 c is configured to count a number of clock cycles up to $\lceil n/w \rceil$.

2) Bit Pattern Generator that Exploits a Nested Property:

The amount of ROM required for the generation of bit pattern vectors $b_{k,n}$ may be significantly reduced in cases where the bit pattern vectors $b_{k,n}$ obey the nested property. Here, the nested property is satisfied if the '1'-valued bits in a bit pattern vector $b_{k,n}$ for a particular combination of k and n always form a sub-set of the '1'-valued bits in a bit pattern vector $b_{k,n}$ for any combination of a greater k and the same n. For example, the nested property is satisfied by the information bit pattern vectors $b_{k,n}$ that are generated by the PW technique, as well as by the FRActally eNhanced Kernel (FRANK) technique of [9]. Rather than storing a bit pattern vector $b_{k,n}$ for each supported combination of k and n, a rank ROM 3801 according to example embodiments of the invention may be used to store a rank vector $R_n$ for each supported n. The rank vector $R_n$ for a particular value of n comprises the integers in the range 0 to n–1, permuted in an order that corresponds to the rank of each bit position, where a particular rank indicates the maximum k for which the corresponding bit in the bit pattern vector $b_{k,n}$ has the value 0.

Figure 9:
FIG. 9 illustrates an example contents of the rank ROM 3801, when using the PW bit pattern construction of [8] for all n∈{2, 4, 8, 16, 32}, according to some example embodiments of the invention.

Referring now to FIG. 9 an example table of the contents of a Rank ROM (such as rank ROM 3801 of FIG. 10), for a set of rank vectors $R_n$ generated using a PW bit pattern construction of [8] for all $n \in \{2, 4, 8, 16, 32\}$, is illustrated according to some example embodiments of the invention. Here, lower ranks correspond to more reliable bits within the kernal information block, such as kernal information block 105 of FIG. 1.

Figure 10:
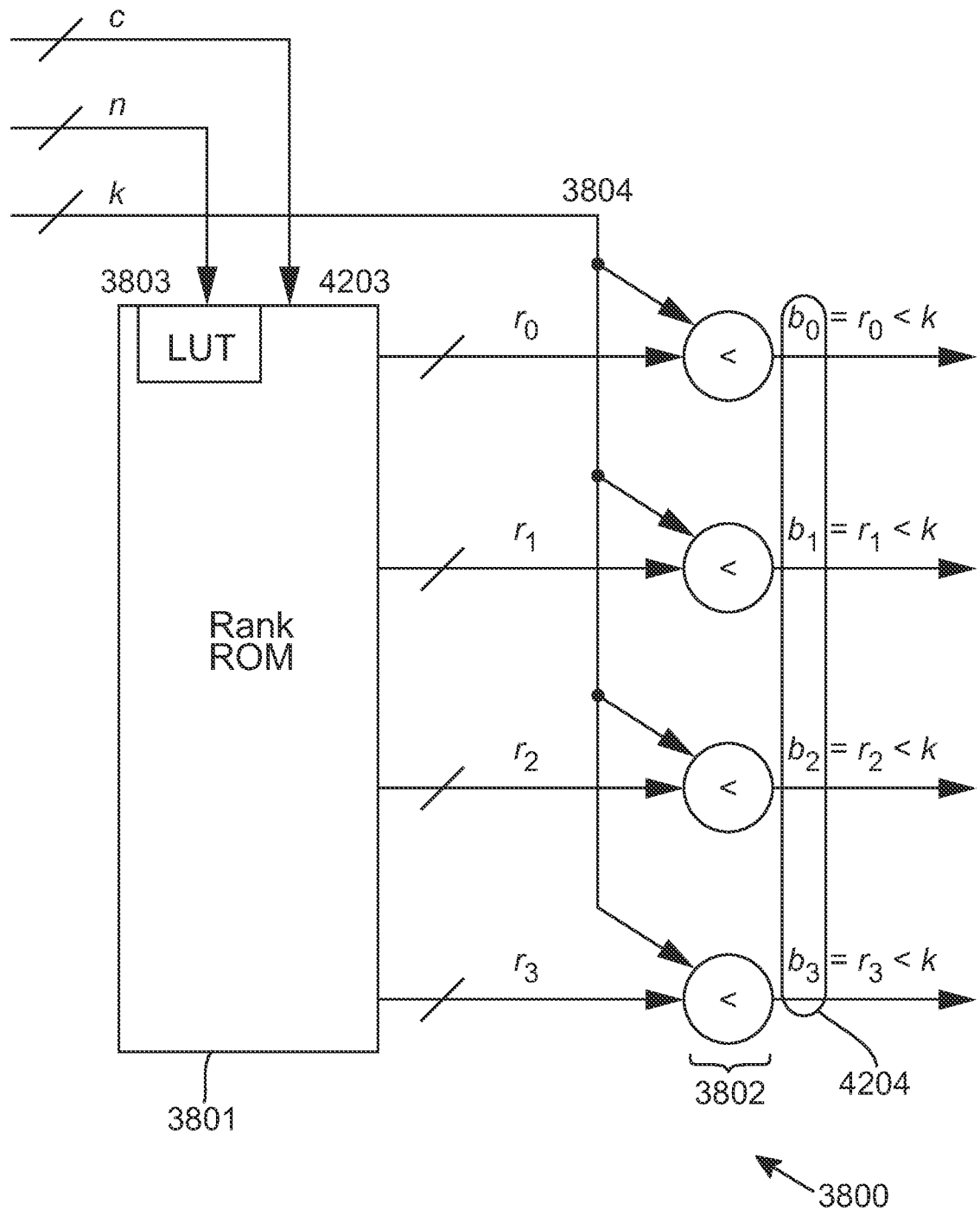
FIG. 10 illustrates a bit pattern generator exploiting the nested property, for the case where w=4, according to some example embodiments of the invention.

Referring now to FIG. 10, a bit pattern generator exploiting the nested property, for the case where w=4, is illustrated according to some example embodiments of the invention. Here, the bit pattern vector $b_{k,n}$ may be generated for a particular combination of k and n by using a bank of w comparators 3802, in order to compare each element of the rank vector $R_n$ with k. If a rank is less than k, then the corresponding bit pattern vector $b_{k,n}$ bit is set to '1', otherwise the corresponding bit pattern bit is set to '0'. Here, the bit pattern bit may be obtained by representing the rank and k using the two's complement fixed-point number representation, performing a subtraction, and then retaining the MSB of the result.

In some examples, and assuming that all entries in the rank ROM 3801 are stored using fixed point numbers having a width of $\log_2(n_{max})$ bits, the total capacity required for the rank ROM 3801 to store all rank vectors $R_n$ for $n \in \{2, 4, 8, \ldots, n_{max}\}$ may be given by $(2n_{max}-2) \log_2(n_{max})$ bits. In this way, the rank ROM stores information sufficient to obtain a rank vector $R_n$ for each supported length of the bit pattern 'n'. This corresponds to 19.98 kbit in a case where $n_{max}=1024$, representing a 98.5% reduction compared to the total capacity required for the bit pattern ROM in the aforementioned naive bit pattern generator.

Alternatively, the total capacity required can be reduced to $\Sigma_{n \in \{2, 4, 8, \ldots, n_{max}\}} n \log_2(n)$ bits, if different widths of $\log_2(n)$ bits are used to store the fixed-point numbers for different values of n, corresponding to 18.00 kbit for $n_{max}=1024$.

In some examples, the rank ROM 3801 has a width of w $\log_2(n_{max})$ bits or w $\log_2(n)$ bits, depending on whether the fixed-point number representation for each rank comprises $\log_2(n_{max})$ bits or $\log_2(n)$ bits. Here, each rank vector $R_n$ is stored across $\lceil n/w \rceil$ consecutive addresses, where n is the output vector length supported by the rank vector $R_n$. It is noteworthy that in cases where n<w, the rank vector may be appended with w-n dummy elements, such that it occupies the width of a single address in the rank ROM 3801.

In some examples, n may be used to index a look-up table 3803, in order to identify the start address of each particular rank vector $R_n$. Alternatively, a separate multiplexed rank ROM 3801 may be used to store the rank vector $R_n$ corresponding to each supported value of n, in which case each may employ a start address of '0'.

During each of the $t=\lceil n/w \rceil$ successive steps of the block conditioning process, a counter 4203 c may be incremented from '0' to 't–1' and used as an offset from the start address of the rank ROM 3801, in order to read successive w-element sub-sets of the rank vector $R_n$. These sub-sets of the rank vector $R_n$ may then be converted into w pattern bits $\{b_0, b_1, b_2, \ldots, b_{w-1}\}$ 4204 using the bank of w comparators 3802, as described above.

In some examples, it is envisaged that a counter 4203 c configured to count from 0 to t–1 may be used for this example circuit and approach, as well as the example circuit of the previous approach.

It is noteworthy that the rank vector $R_n$ described above is different to the index vector $Q_n$ described in [8, 9]. More specifically, the rank vector $R_n$ ranks the reliabilities of the bits within the kernal information block 105, where the rank of the first bit in the kernal information block 105 appears at one of the vector and the rank of the last bit appears at the other end of the vector. By contrast, the index vector $Q_n$ provides the indices of the bits within the kernal information block 105 sorted in order of reliability, where the index of the most reliable bit appears at one end of the vector and the index of the least reliable bit appears at the other end of the vector. However, an approach based on storing the index vector $Q_n$ may require the use of an interleaver or other complex circuitry to interpret the index vector $Q_n$ and produce the bit pattern vector $b_{k,n}$. By contrast, the proposed approach relies only on simple comparators 3802 to interpret the rank vector $R_n$ and produce the bit pattern vector $b_{k,n}$, as described above.

It is envisaged in alternative examples that the elements of the rank vectors $R_n$ described above may be subtracted from n–1 and stored instead in this adjusted form. In this way, the rank ROM stores information sufficient to obtain a rank vector $R_n$ for each supported length of the bit pattern 'n'. In the examples of the information bit pattern vectors $b_{k,n}$ generated using the PW and FRANK techniques, this adjustment would cause bits within the kernal information block 105 having higher reliabilities to correspond to adjusted ranks having higher values, rather than lower values as in the non-adjusted approach. Note that this adjustment is equivalent to reversing the order of the non-adjusted ranks shown in FIG. 9, owing to the symmetric property of the PW technique. In the descriptions above, each comparison to determine if a non-adjusted rank is less than k may be replaced by a comparison to determine if an adjusted rank is greater than or equal to n–k.

3) Bit Pattern Generator Exploiting Nested and Symmetric Properties:

In this bit pattern generator example, the total capacity required for the rank ROM 3801 described above may be reduced by 50% in cases where the bit pattern vectors $b_{k,n}$, obey the nested property and the symmetric property. Here, the symmetric property is satisfied if any pair of elements in the rank vector $R_n$ having the indices i and n–i–1 sum to n–1, for all n and for all i∈[0, n–1]. For example, the symmetric property is satisfied by the information bit pattern vectors $b_{k,n}$ that are generated by the PW technique, but not those generated by the FRANK technique of [9] in general.

In some examples, when the symmetric property is satisfied, the rank ROM 3801 may only need to store the first half of each rank vector $R_n$. In the case where fixed point numbers having a constant width of $\log_2(n_{max})$ bits are used, this reduces the total capacity required for the rank ROM 3801 to store all rank vectors $R_n$ for $n \in \{2, 4, 8, \ldots, n_{max}\}$ to $(n_{max}-1) \log_2(n_{max})$ bits, which corresponds to 9.99 kbit in the case where $n_{max}=1024$. In this way, the rank ROM stores information sufficient to obtain a rank vector $R_n$ for each supported length of the bit pattern 'n'.

Alternatively, this reduces the total capacity required to $\Sigma_{n\in\{2, 4, 8, \ldots, n_{max}\}} n \log_2(n)/2$ bits, in the case where fixed point numbers having varying widths of $\log_2(n)$ bits are used. The rank ROM 3801 has a width of w ranks and each rank vector $R_n$ is stored across $\lceil n/(2w) \rceil$ consecutive addresses, where n is the output vector length supported by the rank vector $R_n$.

It is noteworthy that in cases where n/2<w, the rank vector $R_n$ may be appended with w–n dummy elements and stored across the width of a single address in the rank ROM 3801.

Figure 11:
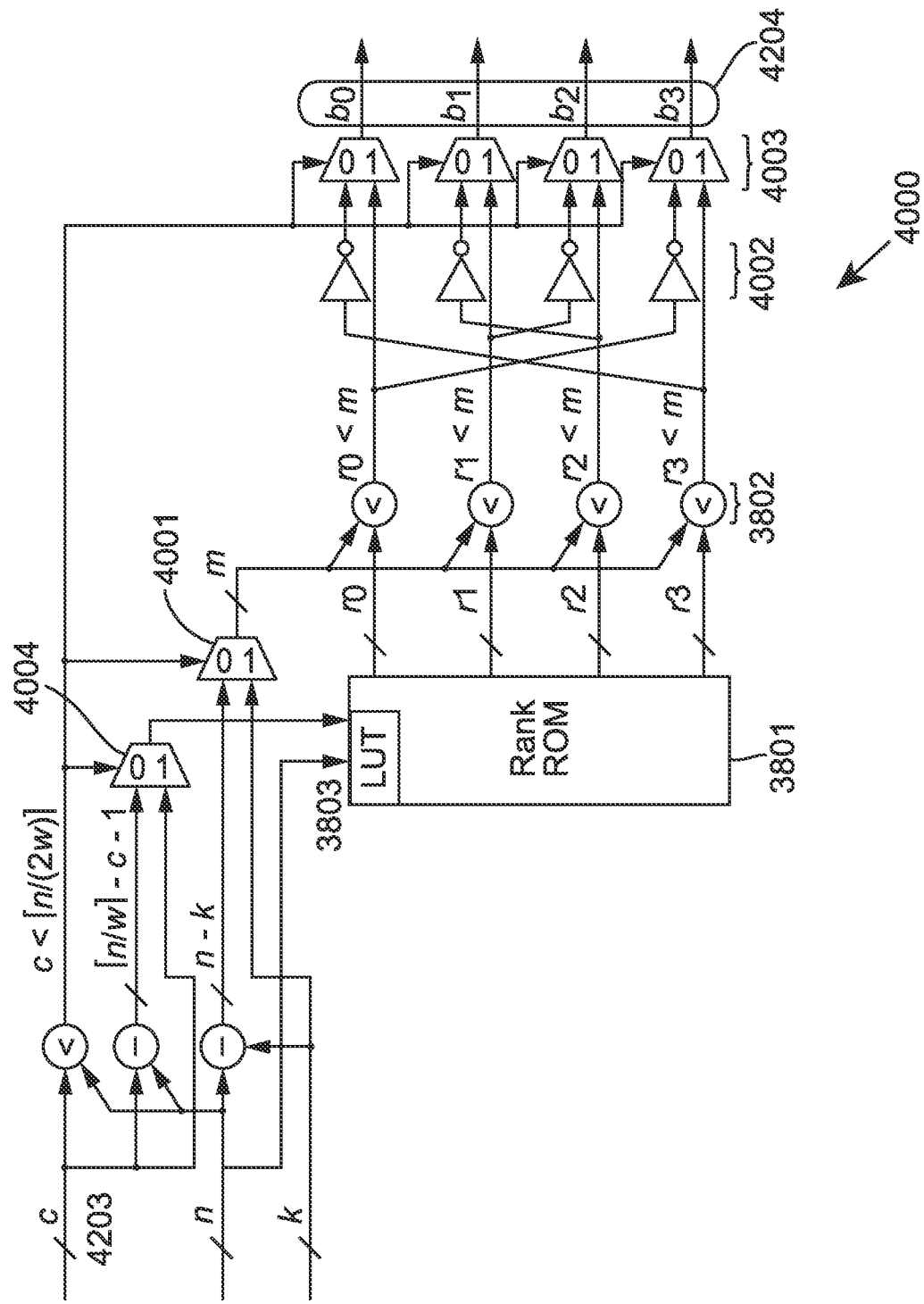
FIG. 11 illustrates a bit pattern generator exploiting the nested and symmetric properties, for the case where w=4, according to some example embodiments of the invention.

Referring now to FIG. 11, a bit pattern generator 4000 exploiting the nested and symmetric properties, for the case where w=4, is illustrated according to some example embodiments of the invention. Here, n may be used to index a look-up table 3803, in order to identify the start address of each particular rank vector $R_n$. Alternatively, a separate multiplexed rank ROM 3801 may be used to store the rank vector $R_n$ corresponding to each supported value of n, in which case each may employ a start address of '0'.

In some examples, the bit pattern generator 4000 may be used to interface with the reduced-capacity rank ROM 3801 and generate the bit pattern vectors $b_{k,n}$. During each of the $t=\lceil n/w \rceil$ successive steps of the block conditioning process, a counter 4203 c may be incremented from '0' to 't–1' and used to generate an offset from the start address of the rank ROM 3801. During the first half of the $t=\lceil n/w \rceil$ successive steps of the block conditioning process when $c<\lceil n/(2w) \rceil$, successive w-element sub-sets of the rank vector $R_n$ are read from incremental addresses in the rank ROM 3801, where the offset from the start address is given by c.

Referring back to the example of FIG. 10, the bank of w comparators 3802 may be used to convert these sub-sets of the rank vector $R_n$ into w pattern bits $\{b_0, b_1, b_2, \ldots, b_{w-1}\}$ 4204. In this example, during the second half of the process when $c \geq \lceil n/(2w) \rceil$, w-element sub-sets of the rank vector nit are read from decremental addresses in the rank ROM 3801, the offset from the start address may be given by ($\lceil n/w \rceil$–c–1). In this way, the same addresses are read as during the first half of the block conditioning process, but in reverse order. In this example, a multiplexer 4004 may be used to provide ($\lceil n/w \rceil$–c–1) rather than c as the offset from the start address of the rank ROM 3801. During this second half of the process, if a rank is greater than or equal to n–k, then the corresponding bit pattern bit is set to '1', otherwise it is set to '0'. This may be implemented by using a multiplexer 4001 in order to provide n–k as the input to the bank of w comparators 3802, rather than k, as well as by using a bank of w NOT gates 4002 to invert the output of the comparators 3802. Furthermore, a bank of w multiplexers 4003 may be used to reverse the order of the w pattern bits $\{b_0, b_1, b_2, \ldots, b_{w-1}\}$ 4204 during the second half of the process, as shown in FIG. 11.

It is envisaged that in alternative examples, the elements of the rank vectors $R_n$ described above may be subtracted from n–1 and stored in this adjusted form instead. In this way, the rank ROM stores information sufficient to obtain a rank vector $R_n$ for each supported length of the bit pattern 'n'. Here, each comparison to determine if a non-adjusted rank is less than k may be replaced by a comparison to determine if an adjusted rank is greater than or equal to n–k. Likewise, each comparison to determine if a non-adjusted rank is greater than or equal to n–k may be replaced by a comparison to determine if an adjusted rank is less than k.

4) Bit Pattern Generator Exploiting the Nested, Recursive and Arithmetic Properties:

In some examples, in cases where the bit pattern vectors $b_{k,n}$ obey nested, recursive and arithmetic properties, the amount of ROM required for the generation of bit pattern vectors $b_{k,n}$ can be significantly further reduced. Here, the recursive property is satisfied if the index vectors $Q_n$ associated with successive values of $n \in \{2, 4, 8, \ldots, n_{max}\}$ can be generated by performing simple operations upon the preceding index vector $Q_{n/2}$. For example, in the PW sequence of [8], the index vector $Q_n$ can be obtained by interlacing $Q_{n/2}$ with $Q_{n/2}+n/2$, according to a particular interlacing pattern $P_n$. The arithmetic property is satisfied if a bit reliability metric can be obtained for each of the n bits in the output vector based only on its index in the range '0' to 'n–1'. In the PW sequence of [8], the reliability of each kernal information bit may be determined by calculating a β expansion upon the binary representation of each bit index in the range '0' to 'n–1'. The elements in a corresponding vector of these bit reliabilities $\beta_n$ may be sorted in order to obtain the index vector $Q_n$, or may be ranked in order to obtain the rank vector $R_n$.

Figure 12:
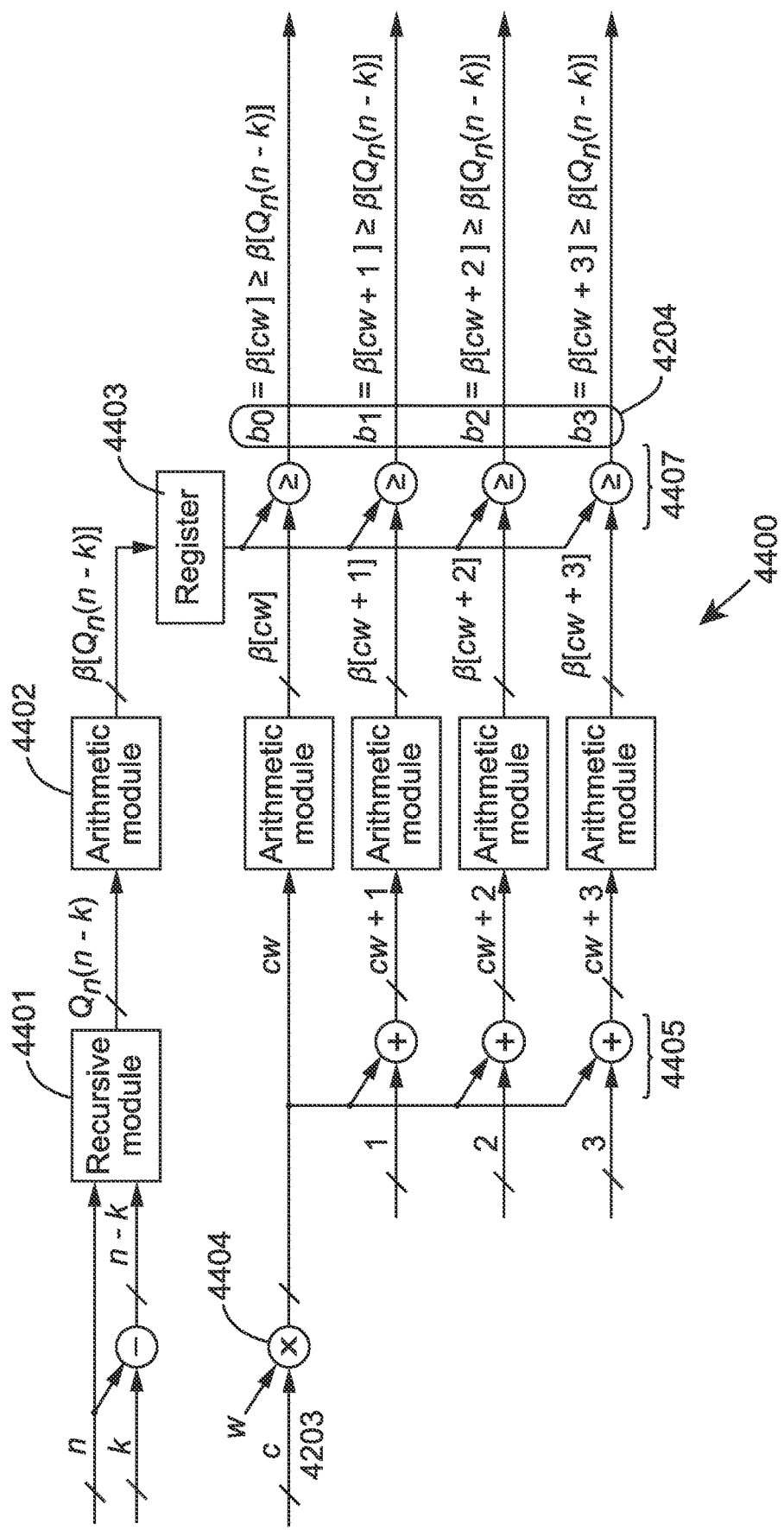
FIG. 12 illustrates a bit pattern generator exploiting the nested, recursive and arithmetic properties, for the case where w=4, according to some example embodiments of the invention.

Referring now to FIG. 12, a bit pattern generator 4400 exploiting the nested, recursive and arithmetic properties, for the case where w=4, is illustrated according to some example embodiments of the invention. In some examples, in cases where the bit pattern vectors $b_{k,n}$ obey nested, recursive and arithmetic properties, the example bit pattern generator 4400 may obtain the bit pattern vector $b_{k,n}$ for a particular combination of k and n. Here, a recursive circuit 4401 may be used to convert the value of n–k into the index $Q_n(n-k)$ of the bit having the $(n-k)^{th}$ highest bit reliability. This recursive circuit 4401 may exploit the recursive property to obtain $Q_n(n-k)$ based on a recursive combination of elements from the preceding index vectors $\{Q_{n/2}(k), Q_{n/4}(k), Q_{n/8}(k), \ldots\}$. In some examples, it is noteworthy that rather than unpacking the entirety of each successive index vector, the unpacking may target only the particular elements that are required to obtain $Q_n(n-k)$. In the case of the PW sequence, the module may include a circuit for performing interlacing, as well as a ROM for storing some or all of the interlacing patterns $\{P_1, P_2, P_4, \ldots, P_{n_{max}}\}$.

In some examples, it is also noteworthy that by also exploiting the symmetric property, this ROM may have a total capacity requirement of 1 kbit. To provide a reference for this significant improvement, let us consider the explanation in [8], whereby a vector $P_n$ is defined, together with a technique for generating $Q_n$ based on $\{P_2, P_4, \ldots P_n\}$. Here, $P_n$ is a binary vector that satisfies the symmetric property. Since n can vary between $\{2, 4, 8, \ldots 1024\}$ at run time, the capability to generate $\{Q_2, Q_4, Q_8, \ldots, Q_{1024}\}$ is required. As a result, the capability to generate all of $\{P_2, P_4, P_8, \ldots, P_{1024}\}$ is needed. In accordance with example embodiments of the present invention, and by exploiting the symmetric property of $P_n$, the $P_n$ vectors can be generated by storing only the first half of each of $\{P_2, P_4, P_8, \ldots P_{1024}\}$. Here, n/2 bits are required to store the first half of $P_n$, giving a total of 1023 bits for all of $\{P_2, P_4, P_8, P_{1024}\}$. In this way, the recursive circuit may be considered to unpack compressed information, in order to obtain $Q_n(n-k)$.

Following this, an arithmetic circuit 4402 may use the arithmetic property to convert the index $Q_n(n-k)$ of the bit having the $(n-k)^{th}$ rank into a bit reliability metric $\beta(Q_n(n-k))$. This value may then be stored in a register 4403 and used throughout the process of generating the bit pattern vector $b_{k,n}$.

More specifically, during each of the $t=\lceil n/w \rceil$ successive steps of the block conditioning process, a counter c 4203 may be incremented from '0' to 't−1' and used to obtain bit indices $\{cw, cw+1, cw+2, \ldots, cw+w-1\}$ for successive w-element sub-sets of the bit pattern vector $b_{k,n}$. In some examples, this may be achieved using the arrangement of a multiplier 4404 and a bank of w−1 adders 4405, as shown in FIG. 12. Following this, a bank of w replicas 4406 of the arithmetic circuit may be used to compute corresponding bit reliabilities $\{\beta[cw], \beta[cw+1], \beta[cw+2], \ldots, \beta[cw+w-1]\}$, which may then be compared with $\beta(Q_n(n-k))$ using a bank of w comparators 4407, in order to obtain the corresponding elements of the bit pattern vector $b_{k,n}$. In the PW sequence, greater $\beta$ expansion values imply greater bit reliabilities and so the bank of w comparators 4407 obtains the bit pattern bits $\{b_0, b_1, b_2, \ldots, b_{w-1}\}$ 4204 by determining whether the corresponding bit reliabilities $\{\beta[cw], \beta[cw+1], \beta[cw+2], \ldots, \beta[cw+w-1]\}$ are greater than or equal to $\beta(Q_n(n-k))$.

It is noteworthy that it may be possible to achieve a power saving by exploiting the recursive property of the bit pattern vector $b_{k,n}$. For example, in the case of a PW sequence the recursive properties may be used to determine relationships between bits in the kernal information block. More specifically, it may be determined that if a particular bit is chosen as a frozen bit, then this guarantees that particular other bits will also be chosen as frozen bits. Likewise, it may be determined that if a particular bit is chosen as an information bit, then this guarantees that particular other bits will also be chosen as information bits. This may be exploited in the bit pattern generator 4400 of FIG. 12, to disable particular arithmetic circuits during particular steps in the process, whenever the corresponding bit pattern bit can be determined based on decisions that have been made in earlier steps of the process.

In some examples, it is envisaged that the approach of FIG. 12 may be simplified further in the case of encoded block conditioning, where the bit reliabilities are simple functions of the bit indices. Here, during each of the $t=\lceil n/w \rceil$ successive steps of the encoded block conditioning process, a counter c 4203 may be incremented from '0' to t−1' and used to control a circuit that provides successive w-element sub-sets of the bit pattern vector $b_{k,n}$, depending on the values of n and k.

Figure 13:
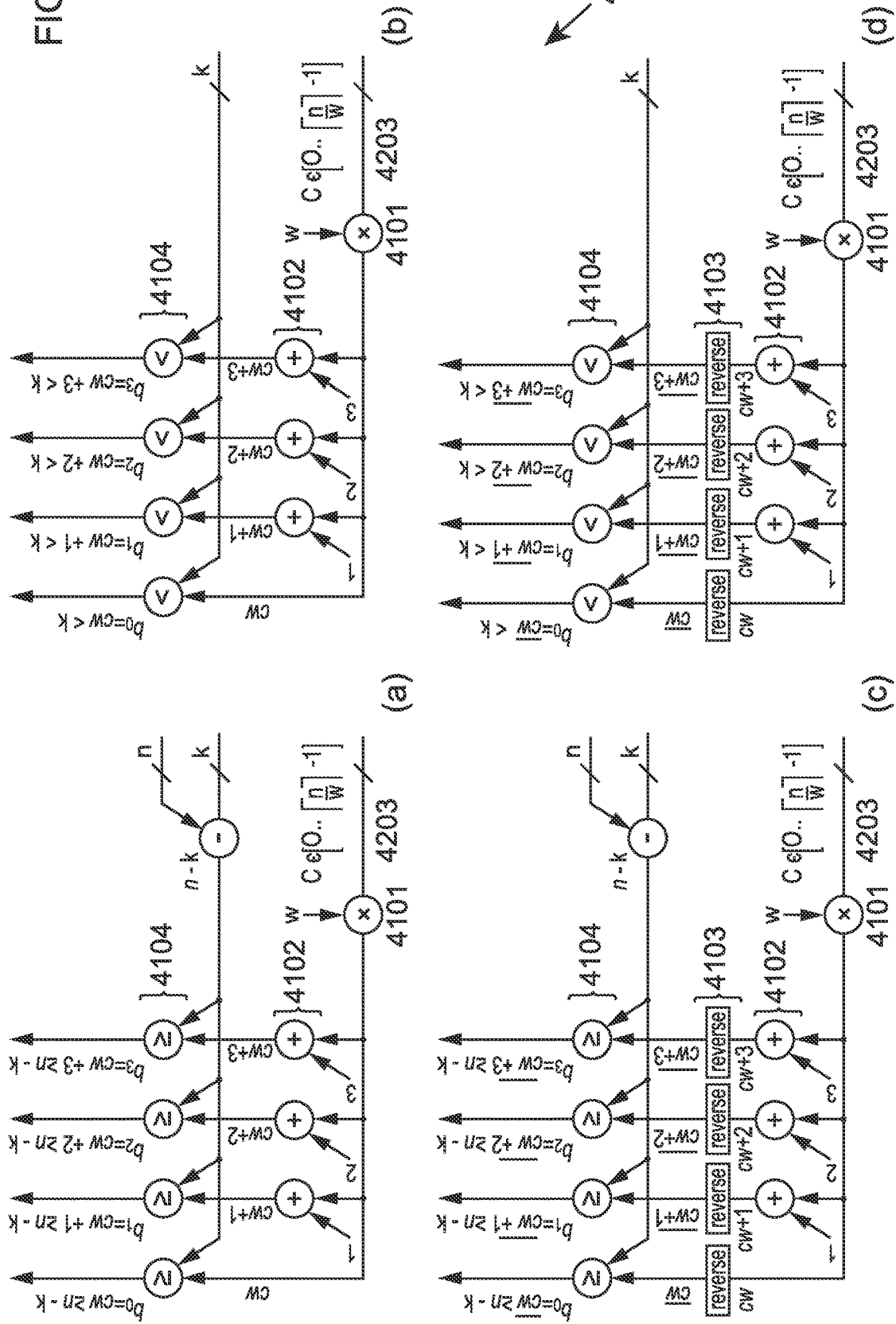
FIG. 13 illustrates circuits for generating w bits from a particular bit pattern in each step of the encoded block conditioning process: (a) Block puncturing; (b) Block shortening; (c) Bit reversal puncturing; and (d) Bit reversal shortening, according to some example embodiments of the invention.

Referring now to FIG. 13 circuits for generating w bits from a particular bit pattern in each step of the encoded block conditioning process are illustrated, according to examples of the invention. For example the illustrated circuits include: (a) Block puncturing; (b) Block shortening; (c) Bit reversal puncturing; and (d) Bit reversal shortening, according to some example embodiments of the invention. Suitable circuits for block puncturing, block shortening, bit reversal puncturing and bit reversal shortening [16] are illustrated in FIGS. 13a-13d. Here, a multiplier 4101 and a bank of w−1 adders 4102 are used to convert the counter c 4203 into the indices of the bits in the current sub-set of the bit pattern vector $\{cw, cw+1, cw+2, \ldots, cw+w-1\}$. In the bit-reversal schemes of FIGS. 13c and 13d, a bank of w reverse modules 4103 is used to reverse the order of the bits in the $\log_2(n)$-bit binary representation of each bit index, in order to produce the reversed bit indices $\{\overline{cw}, \overline{cw+1}, \overline{cw+2}, \ldots, \overline{cw+w-1}\}$. Finally, a bank of w comparators is used to compare either the bit indices or the reversed bit indices with either k or n−k. More specifically, the bit pattern bits $\{b_0, b_1, b_2, \ldots, b_{w-1}\}$ are set to one if the corresponding bit indices or reversed bit indices are less than kin the shortening schemes of FIGS. 13b and 13d. By contrast, the bit pattern bits $\{b_0, b_1, b_2, \ldots, b_{w-1}\}$ are set to one if the corresponding bit indices or reversed bit indices are greater than or equal to n−k in the puncturing schemes of FIGS. 13a and 13c. Compared to FIG. 12, it may be observed that the arithmetic module 4401 and the recursive module 4402 cancel each other out in all cases shown in FIGS. 13a-13d. In the case of FIGS. 13c and 13d, the functionality of the arithmetic modules 4406 is performed by the bit reversal operations 4103.

Examples of Proposed Hardware Implementations for Frozen Bit Insertion and Removal Several polar code sequences were proposed and compared in [17] and the Huawei sequence was selected for the 3GPP New Radio polar code at 3GPP TSG RAN WG1 Meeting #90 [18, Al 6.1.4.2.2]. The Huawei sequence from [17] is defined for a maximum mother code block length of $N_{max}=1024$ bits and the sequence $Q_N$ for a shorter power-of-two mother block length N can be extracted by exploiting the sequence's nested property. For example, the sequence for N=64 is $Q_{64}$=[0, 1, 2, 4, 8, 16, 32, 3, 5, 9, 6, 17, 10, 18, 12, 33, 20, 34, 24, 36, 7, 11, 40, 19, 13, 48, 14, 21, 35, 26, 37, 25, 22, 38, 41, 28, 42, 49, 44, 50, 15, 52, 23, 56, 27, 39, 29, 43, 30, 45, 51, 46, 53, 54, 57, 58, 60, 31, 47, 55, 59, 61, 62, 63]. Here, each successive element $Q_N[u]$ (where $u \in [0, N-1]$) of the sequence $Q_N$ indicates the position (in the range [0, N−1]) of the next more reliable uncoded bit of the polar code, where $Q_N[0]$ and $Q_N[N-1]$ give the positions of the least and most reliable bits, respectively. For example, $Q_{64}[5]=16$ indicates that the bit in position 16 is more reliable than the bits in positions $Q_{64}[0]$ to $Q_{64}[4]$, but less reliable than the bits in positions $Q_{64}[6]$ to $Q_{64}[63]$.

Two polar code rate matching schemes were proposed and compared in [19] and Option 2 was selected at 3GPP TSG RAN WG1 Meeting #90 [18, Al 6.1.4.2.3]. Option 2 from [19] defines a sub-block interleaver, which decomposes the polar encoded bits into 32 equal-length sub-blocks, which are reordered according to the interleaver pattern π=[0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31]. Here, each element π[m] (where m∈[0,31]) of the interleaver pattern π indicates the position (in the range [0,31]) that the interleaved sub-block in position m is sourced from. For example, π[9]=16 indicates that the interleaved sub-block in position 9 is sourced from the sub-block that was in position 16 before interleaving. Furthermore, dependent on the uncoded block length K and the encoded block length M, Option 2 from [19] defines rules which govern the selection of the mother code block length N and the selection of puncturing, shortening or repetition. Crucially, Option 2 from [19] also defines rules which govern the selection of frozen bits, which depends on all of the other aspects of this rate matching scheme.

More specifically, the rate matching scheme influences which of the N uncoded bits are provided by the K information and Cyclical Redundancy Check (CRC) bits. The remaining N−K uncoded bits are provided by frozen bits, which may be scrambled by User Equipment Identification (UE-ID) bits. In the absence of rate matching, the positions of the K information and CRC bits would be selected by using the sequence $Q_N$ to identify the K uncoded bits having the highest reliability, with all other uncoded bits becoming frozen. However, when rate matching is employed, this requires a set of frozen bits to be identified independently of and before applying the sequence. Following this, the K information and CRC bits are positioned within the remaining uncoded bits by using the sequence $Q_N$ to identify those having the highest reliability, with all other remaining uncoded bits becoming frozen.

This section proposes examples of hardware implementations that can perform the frozen bit insertion and removal processes for several bits at a time, allowing them to be completed using a small number of clock cycles. More specifically, this allows frozen bits to be interlaced with information bits and CRC bits, before polar encoding. Likewise, this allows the frozen bits to be deinterlaced from the information and CRC bits, following polar decoding. Examples of the proposed approach may also be adapted to interlace and deinterlace Parity Check (PC) bits. Examples of the proposed hardware implementations do not require circuits for sorting, interleaving or performing other complex operations, nor do they require an excessive amount of ROM for storing pre-computed frozen bit positions or intermediate variables. Some envisaged examples of the proposed hardware implementations are detailed below.

Figure 16:
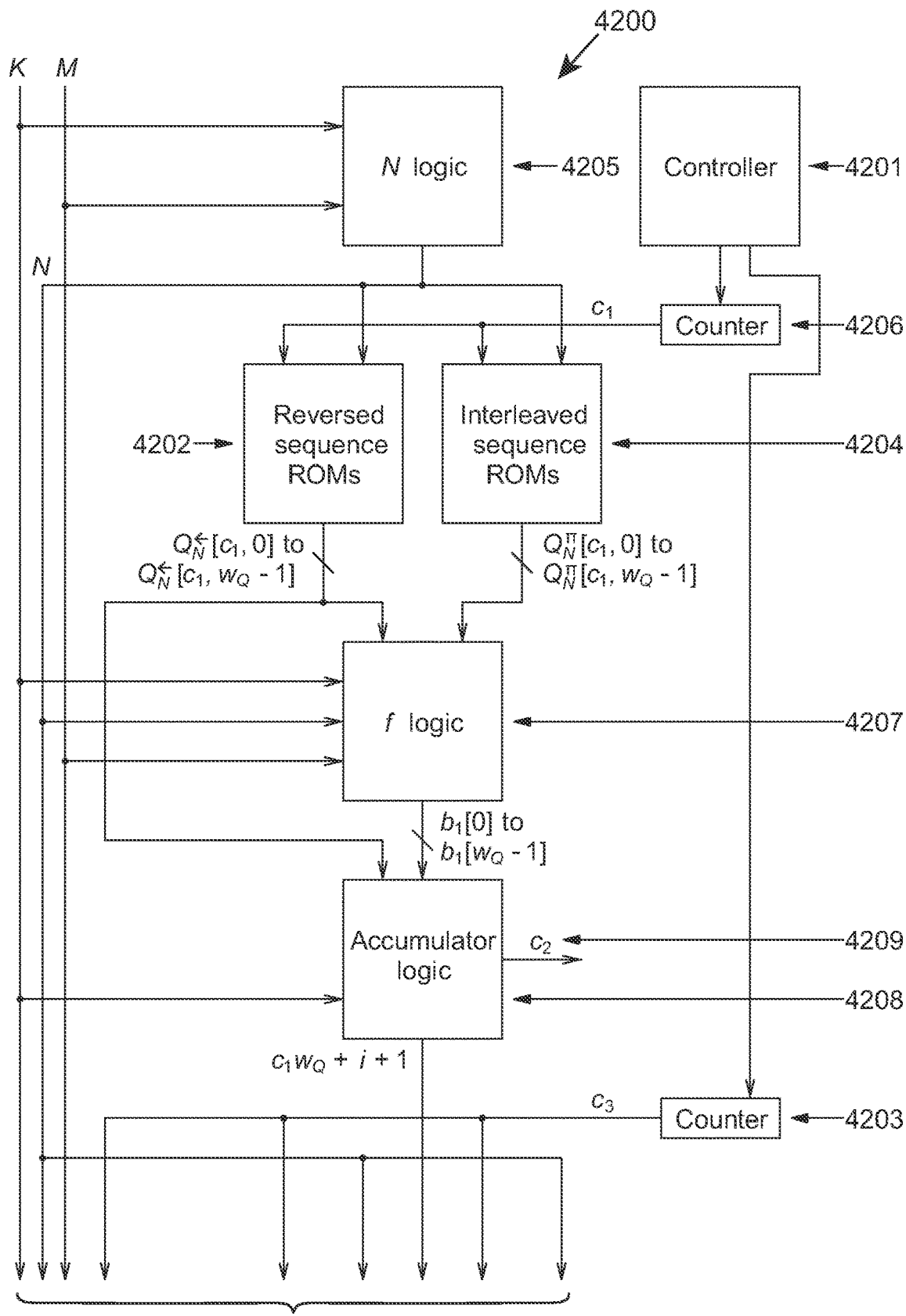
FIG. 16 provides a schematic of the proposed hardware implementations for frozen bit insertion and removal, in accordance with some example embodiments of the invention.
Figure 16:
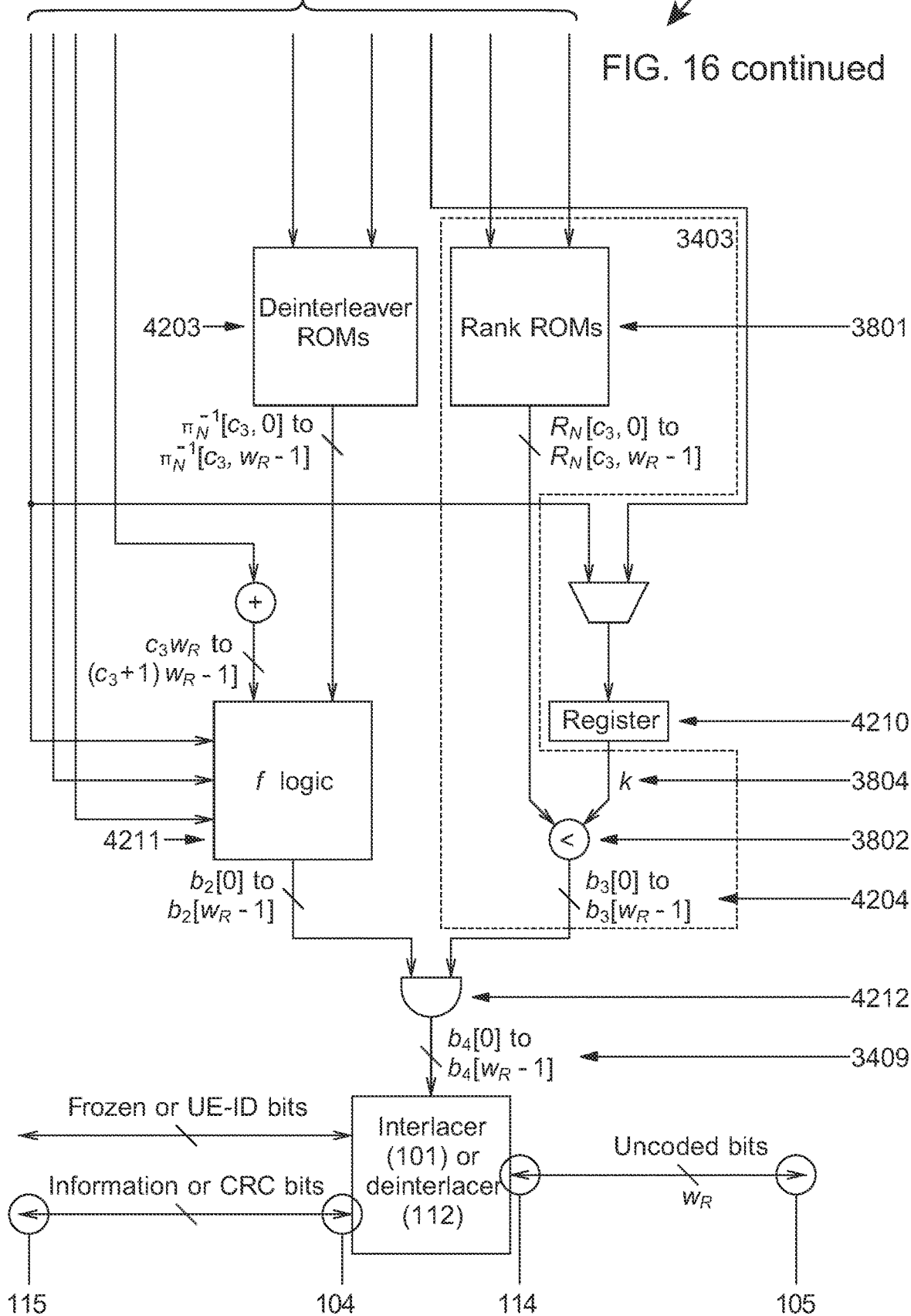
Figure 21:
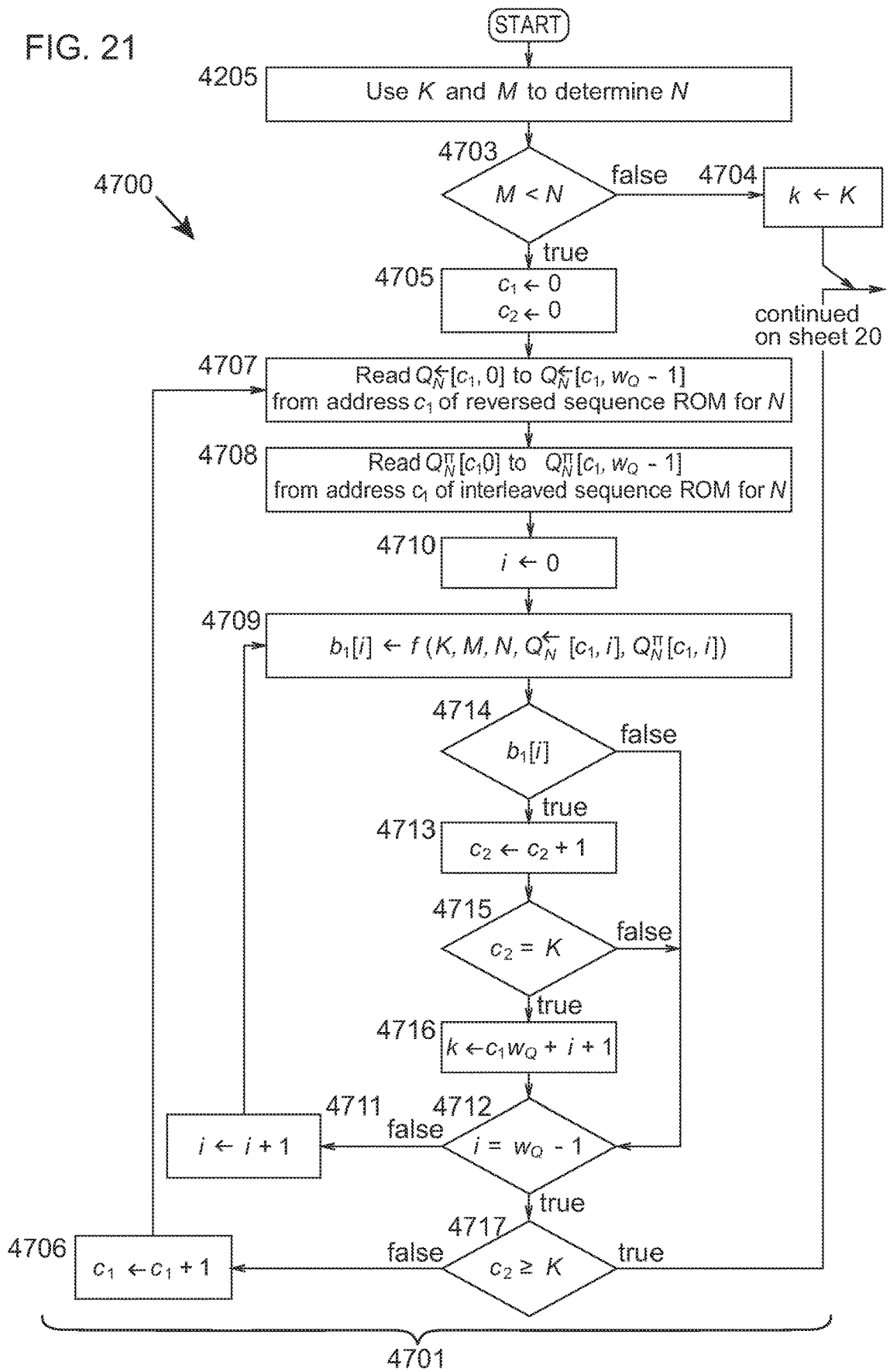
FIG. 21 provides a flow chart of the proposed hardware implementations for frozen bit insertion and removal, in accordance with some example embodiments of the invention.
Figure 21:
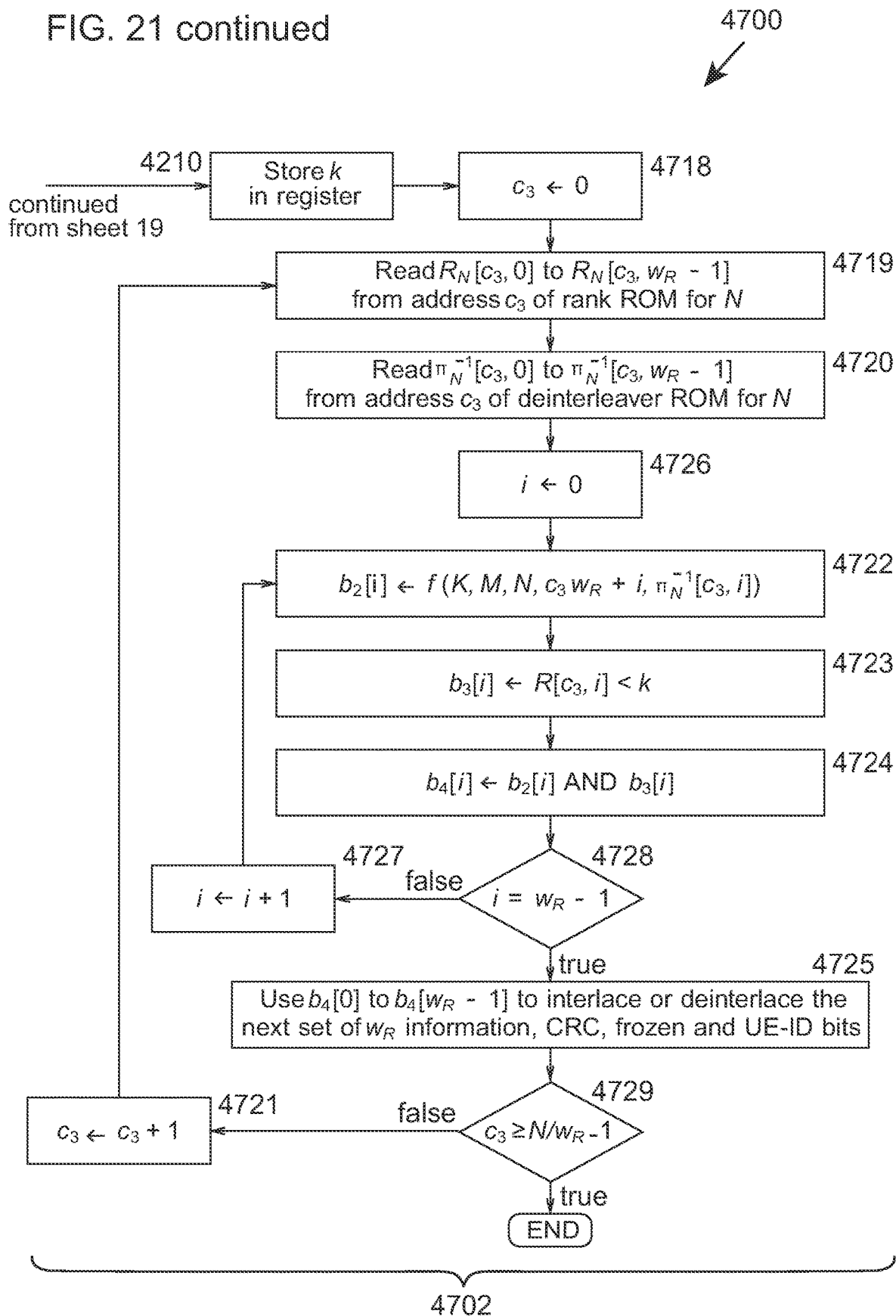
Figure 22:
FIG. 22 exemplifies elements of the bit pattern generated in each of the N/$w_R$=16 clock cycles of the second sub-process (identified as 4702) for K=32, M=68, N=64 and $w_R$=4, in accordance with some example embodiments of the invention. In this case, repetition is used and k=32. Since M<N is not satisfied, no clock cycles are used to complete the first sub-process (identified as 4701), irrespective of $w_Q$.
Figure 23:
FIG. 23 exemplifies elements of the bit pattern generated in each of the N/$w_R$=16 clock cycles of the second sub-process for K=32, M=56, N=64 and $w_R$=4, in accordance with some example embodiments of the invention. In this case, shortening is used and k=40. When $w_Q$=8, five clock cycles are used to complete the first sub-process 4701.
Figure 24:
FIG. 24 exemplifies elements of the bit pattern generated in each of the N/$w_R$=16 clock cycles of the second sub-process for K=24, M=56, N=64 and $w_R$=4, in accordance with some example embodiments of the invention. In this case, puncturing is used and k=25. When $w_Q$=8, four clock cycles are used to complete the first sub-process 4701.
Figure 25:
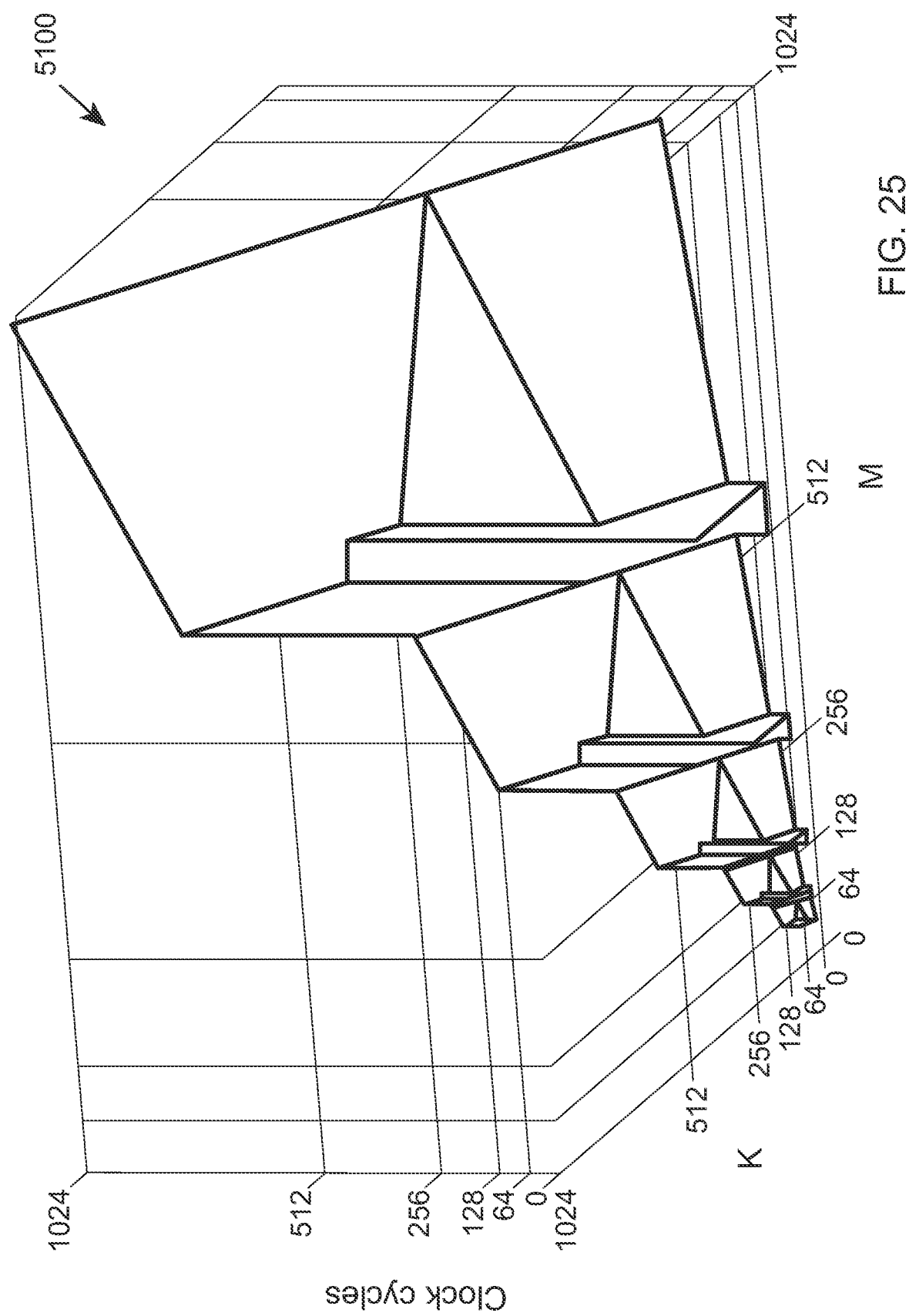
FIG. 25 plots an example of a number of clock cycles required by the first sub-process 4701 as a function of $M \in [17, 1024]$ and $K \in [\lceil M/8 \rceil, M-1]$, for the worst case where $w_Q=1$, in accordance with some example embodiments of the invention. When $w_Q$ adopts the value of a higher power of two, these numbers of clock cycles may be linearly scaled down and then rounded up to the nearest integer.
Figure 26:
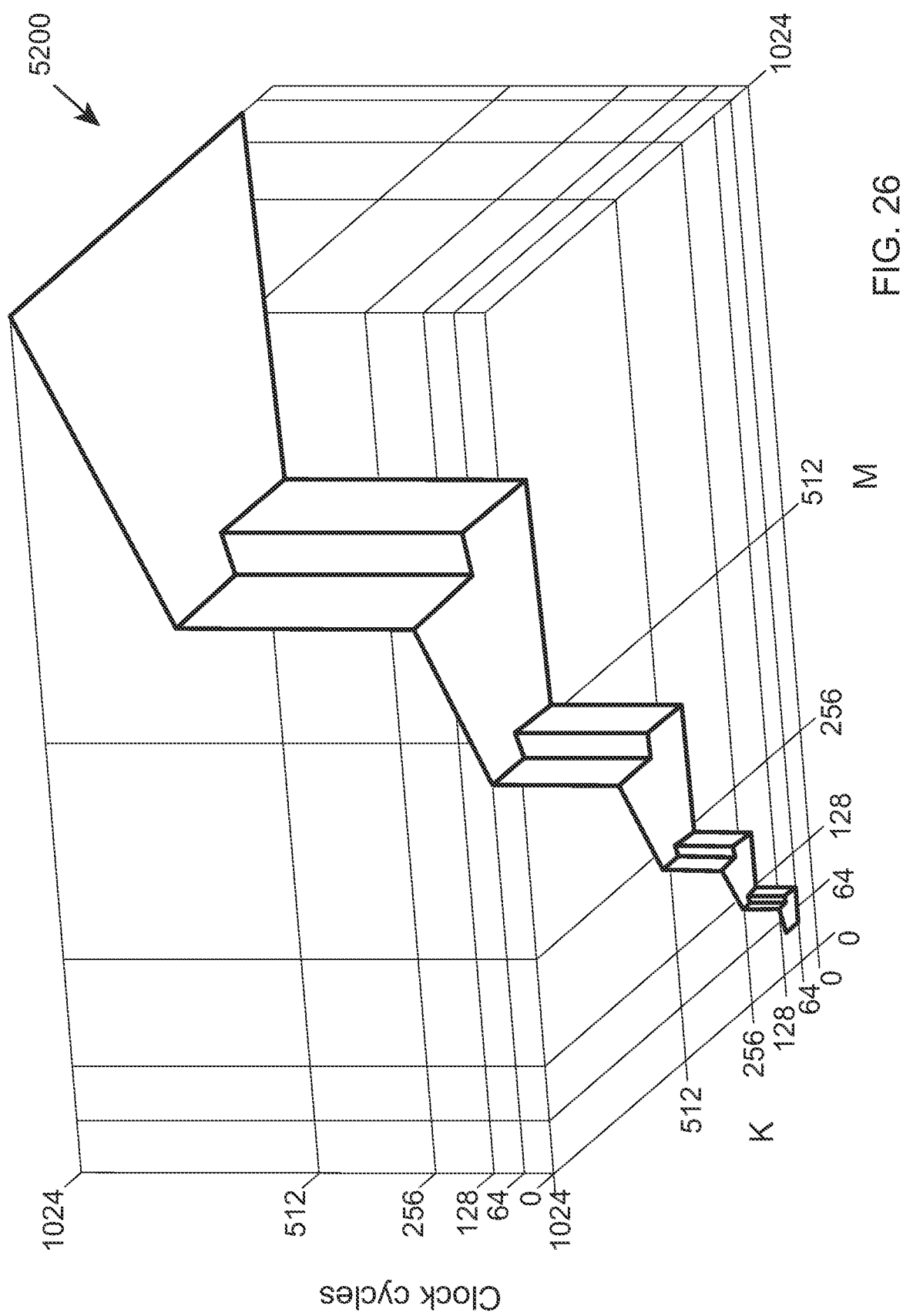
FIG. 26 plots an example of a number of clock cycles required by the second sub-process as a function of $M \in [17, 1024]$ and $K \in [\lceil M/8 \rceil, M-1]$, for the worst case where $w_R=1$, in accordance with some example embodiments of the invention. When $w_R$ adopts the value of a higher power of two, these numbers of clock cycles may be linearly scaled down and then rounded up to the nearest integer.

During a first sub-process 4701, as identified in FIGS. 16, 21, and 25, some examples of the proposed hardware implementations consider $w_Q$ uncoded bit positions at a time in order of decreasing reliability, considering whether each successive uncoded bit is frozen by rate matching. This continues until K number of bits that are not frozen by rate matching have been found, whereupon the reliability of the $K^{th}$-most reliable unfrozen bit is determined and referred to as the threshold reliability 3804. During a second sub-process 4702, as identified in FIGS. 16, 21-24 and 26, $w_R$ uncoded bit positions are considered at a time in their natural order. Each of the $w_R$ uncoded bit positions is determined to be an information or CRC bit if its reliability is no less than the threshold reliability 3804 and if it is not frozen by rate matching, otherwise it is determined to be a frozen bit. In this way, a bit pattern is generated $w_R$ bits at a time 3409 throughout the second sub-process 4702, which identifies whether each uncoded bit is an information or CRC bit, or if it is a frozen bit. At the same time, the bit pattern may be used to interlace 101 or deinterlace 112 $w_R$ uncoded bits at a time in their natural order. More specifically, the information and CRC bits may be interlaced with the frozen bits throughout the second sub-process 4702, in order to implement frozen bit insertion 101 during polar encoding. Likewise, the information and CRC bits may be deinterlaced from the frozen bits throughout the second sub-process 4702, in order to implement frozen bit removal 112 during polar decoding.

Some examples of the proposed hardware implementations for frozen bit insertion and removal are detailed in the schematic of FIG. 16, where the top and bottom halves correspond to the first and second sub-processes 4701 and 4702, respectively. This schematic includes four sets of ROMs 4202, 3801, 4203, 4204, as detailed below. The operation of these ROMs and the logic shown in FIG. 16 is coordinated by the controller 4201, as detailed below.

1) ROMs

As shown in FIG. 16, some examples of the proposed hardware implementations employ four sets of ROMs, as follows.

A set of reversed sequence ROMs 4202 stores the set of reversed sequences $\{Q_{32}^{\leftarrow}, Q_{64}^{\leftarrow}, Q_{128}^{\leftarrow}, \ldots, Q_{1024}^{\leftarrow}\}$. Here, each successive element $Q_N^{\leftarrow}[u]=Q_N[N-u-1]$ (where $u\in[0, N-1]$) of the reversed sequence $Q_N^{\leftarrow}$ indicates the position (in the range [0,N−1]) of the next less reliable uncoded bit of the polar code, where $Q_N^{\leftarrow}[0]$ and $Q_N^{\leftarrow}[N-1]$ give the positions of the most and least reliable bits, respectively.

A set of rank ROMs 3801 stores a set of rank sequences $\{R_{32}, R_{64}, R_{128}, \ldots, R_{1024}\}$. Here, each element $R_N[u]$ (where $u\in[0, N-1]$) of the rank sequence $R_N$ indicates the reliability ranking (in the range [0,N−1]) of the corresponding uncoded bit of the polar code, where a lower value $R_N[u]$ indicates a higher reliability. For example, $R_N[u_1]=0$ and $R_N[u_2]=N-1$ indicate that the uncoded bits $u_1$ and $u_2$ are the most and least reliable bits, respectively. The relationship between the reversed sequence $Q_N^{\leftarrow}$ and the rank sequence $R_N$ is such that $Q_N^{\leftarrow}[R_N[u]]=u$.

A set of deinterleaver ROMs 4203 stores a set of deinterleaver patterns $\{\pi_{32}^{-1}, \pi_{64}^{-1}, \pi_{128}^{-1}, \ldots, \pi_{1024}^{-1}\}$. Here, each element $\pi_N^{-1}[u]$ (where $u\in[0,N-1]$) of the deinterleaver pattern $\pi_N^{-1}$ indicates the position (in the range [0,N−1]) that the polar encoded bit in position u is interleaved to, during rate matching. The relationship between the deinterleaver pattern $\pi_N^{-1}$ and the interleaver pattern π is such that $\pi[\lfloor\pi_N^{-1}[u]\cdot 32/N\rfloor]=\lfloor u\cdot 32/N\rfloor$. Furthermore, all elements $\pi_N^{-1}[u]$ in $\pi_N^{-1}$ that evaluate to the same value of $\lfloor\pi_N^{-1}[u]\cdot 32/N\rfloor$ appear in consecutive positions within $\pi_N^{-1}$, in ascending order.

A set of interleaved sequence ROMs 4204 stores a set of interleaved sequences $\{Q_{32}^{\pi}, Q_{64}^{\pi}, Q_{128}^{\pi}, \ldots, Q_{1024}^{\pi}\}$. Here, each element $Q_N^{\pi}[u]$ of the interleaved sequence $Q_N^{\pi}$ is obtained as $Q_N^{\pi}[u]=\pi_N^{-1}[Q_N^{\leftarrow}[u]]$.

Figure 17:
FIG. 17 exemplifies elements $Q_N^{\leftarrow}[c, i]$ of the reversed sequence ROM for N=64 and $w_Q$=8, where i∈[0,$w_Q$−1] and c∈[0, N/$w_Q$−1], in accordance with some example embodiments of the invention.
Figure 18:
FIG. 18 exemplifies elements $Q_N^{\pi}[c, i]$ of the interleaved sequence ROM for N=64 and $w_Q$=8, where i∈[0, $w_Q$−1] and c∈[0, N/$w_Q$−1], in accordance with some example embodiments of the invention.

Each address in each reversed sequence ROM 4202 and each interleaved sequence ROM 4204 stores $w_Q$ elements of the respective sequences, where $w_Q$ is a power of two. More specifically, each successive group of $w_Q$ consecutive elements of each reversed sequence $Q_N^{\leftarrow}$ are stored in successive addresses of the corresponding reversed sequence ROM 4202, as exemplified for N=64 and $w_Q$=8 in FIG. 17. Likewise, each successive group of $w_Q$ consecutive elements of each interleaved sequence $Q_N^{\pi}$ are stored in successive addresses of the corresponding interleaved sequence ROM 4204, as exemplified for N=64 and $w_Q$=8 in FIG. 18. More specifically, each element in these ROMs 4202, 4204 is obtained according to $Q_N^{\leftarrow}[c,i]=Q_N^{\leftarrow}[c\cdot w_Q+i]$ and $Q_N^\pi[c,i]=Q_N^\pi[c \cdot w_Q+i]$, where $c\in[0, N/w_Q-1]$ is the corresponding address and $i\in[0, w_Q-1]$ is the index of the element within that address.

Figure 19:
FIG. 19 exemplifies elements $\pi_N^{-1}[c, i]$ of the deinterleaver ROM for N=64 and $w_R$=4, where i∈[0, $w_R$−1] and c∈[0, N/$w_R$−1], in accordance with some example embodiments of the invention.
Figure 20:
FIG. 20 exemplifies elements $R_N[c,i]$ of the rank ROM for N=64 and $w_R$=4, where i∈[0, $w_R$−1] and c∈[0, N/$w_R$−1], in accordance with some example embodiments of the invention.

By contrast, each address in each deinterleaver ROM 4203 and each rank ROM 3801 stores $w_R$ elements of the respective sequences, where $w_R$ is a power of two that may be selected independently of $w_Q$. More specifically, each successive group of $w_R$ consecutive elements of each deinterleaver pattern $\pi_N^{-1}$ are stored in successive addresses of the corresponding deinterleaver ROM 4203, as exemplified for N=64 and $w_R$=4 in FIG. 19. Likewise, each successive group of $w_R$ consecutive elements of each rank sequence $R_N$ are stored in successive addresses of the corresponding rank ROM 3801, as exemplified for N=64 and $w_R$=4 in FIG. 20. More specifically, each element in these ROMs 4203, 3801 is obtained according to $\pi_N^{-1}[c,i]=\pi_N^{-1}[c \cdot w_R+i]$ and $R_N[c,i]=R_N[c \cdot w_R+i]$, where $c\in[0,N/w_R-1]$ is the corresponding address and $i\in[0, w_R-1]$ is the index of the element within that address.

Note that in cases where $N<w_Q$ or $N<w_R$, each sequence stored in a corresponding ROM 4202, 3801, 4203, 4204 may be appended with $w_Q$–N or $w_R$–N dummy elements having the value N–1, in order to fill a single address of the ROM. Note that rather than storing sequences of the same type in separate ROMs corresponding to each supported value of N, these sequences could be stored within different address spaces of a single larger ROM. In this case, the value of N may be used to index a lookup table 3803, which identifies the start address of the corresponding sequence.

Assuming that all entries in the ROMs 4202, 3801, 4203, 4204 are stored using fixed point numbers having a width of $\log_2(N_{max})$=10 bits, the total capacity required for the ROMs to store all sequences $Q_N^\leftarrow$, $Q_N^\pi$, $\pi_N^{-1}$ and $R_N$ for $N\in\{32, 64, 128, \ldots, 1024\}$ is 78.75 kbit. Alternatively, the total capacity required can be reduced to 71.62 kbit, if different widths of $\log_2(N)$ bits are used to store the fixed-point numbers for different values of N.

2) Logic and Controller

As shown in FIG. 16, some examples of the proposed hardware implementations for frozen bit insertion and removal comprise four sets of ROMs 4202, 3801, 4203, 4204 and various logic circuits. These operate under the coordination of the controller 4201 shown in FIG. 16, according to the flowchart of FIG. 21. As described above, some examples of the proposed hardware implementations complete the processes of frozen bit insertion or removal using two sub-processes 4701 and 4702, which correspond to the left and right halves of FIG. 21.

At the beginning of the first sub-process 4701, the N logic 4205 of FIG. 16 is used to compute the mother code block size N, as a function of the number K of information and CRC bits, as well as of the number M of polar encoded bits that remain after rate matching. As shown in FIG. 21, if M<N is not satisfied 4703, then the first sub-process 4701 can be immediately concluded by setting the rank threshold k equal to K 4704, where k implements the reliability threshold 3804 mentioned above. Otherwise, the first sub-process 4701 must use further computations in order to determine the rank threshold k 3804.

In this case, the controller 4201 resets the counters $c_1$ and $c_2$ shown in FIG. 16 to zero 4705. In successive clock cycles, successive addresses of the reversed sequence ROM 4202 and the interleaved sequence ROM 4204 corresponding to the particular value of N are indexed using the counter $c_1$ 4206, which is incremented in each clock cycle 4706. As shown in FIGS. 16 and 21, the $w_Q$ consecutive elements $Q_N^\leftarrow[c_1,0]$ to $Q_N^\leftarrow[c_1,w_Q-1]$ and $Q_N^\pi[c_1,0]$ to $Q_N^\pi[c_1,w_Q-1]$ of the reversed sequence $Q_N^\leftarrow$ and the interleaved sequence $Q_N^\pi$ are read 4707, 4708 from the reversed sequence ROM 4202 and the interleaved sequence ROM 4204, respectively.

Each successive set of elements read from the reversed sequence and interleaved sequence ROMs 4202, 4204 in each successive clock cycle is provided to the first set of f logic 4207 shown in FIG. 16. As shown in FIG. 21, this f logic 4207 obtains a set of $w_Q$ binary flags by computing $b_1[i]=f(K,M,N,Q_N^\leftarrow[c_1,i], Q_N^\pi[c_1,i])$ for each value of $i\in[0, w_Q-1]$ in parallel 4709, where $$f(K,M,N,u,\pi_N^{-1}[u])=M\geq N \text{ OR } (K/M>7/16 \text{ AND } \pi_N^{-1}[u]<M) \text{ OR } (K/M\leq 7/16 \text{ AND } \pi_N^{-1}[u]\geq N-M \text{ AND } ((M\geq 3N/4 \text{ AND } u\geq\lceil 3N/4-M/2\rceil) \text{ OR } (M<3N/4 \text{ AND } u\geq\lceil 9N/16-M/4\rceil))) \quad (1)$$

The binary flags $b_1[0]$ to $b_1[w_Q-1]$ obtained in each clock cycle are provided to the accumulator logic 4208 shown in FIG. 16. As shown in FIG. 21, this uses an index i which is initially set to 0 (4710) and is incremented (4711) towards $w_Q-1$ (4712), in order to consider the binary flags in order from $b_1[0]$ to $b_1[w_Q-1]$. At the same time, the counter $c_2$ 4209 is incremented once (4713) for each of the binary flags having the value 1 (4714). When the counter $c_2$ reaches the value K (4715), the threshold rank k 3804 is set equal to $c_1 w_Q+i+1$ (4716), whereupon the first sub-process 4701 is completed. More specifically, the first sub-process 4701 continues through successive clock cycles until $c_2 \geq K$ is satisfied (4717), which will typically occur before $c_1$ reaches the index of the final address of the reversed sequence and interleaved sequence ROMs 4202, 4204.

As shown in FIG. 16 and FIG. 21, the threshold rank k 3804 is stored in a register 4210, so that it can be used throughout the second sub-process 4702. At the start of the second sub-process 4702, the controller 4201 resets the counter $c_3$ 4203 shown in FIG. 16 to zero 4718. In successive clock cycles, successive addresses of the deinterleaver ROM 4203 and the rank ROM 3801 corresponding to the particular value of N are indexed using the counter $c_3$, which is incremented in each clock cycle 4721, until $c_3 \geq N/w_R-1$ is satisfied 4729. As shown in FIG. 16 and FIG. 21, the $w_R$ consecutive elements $\pi_N^{-1}[c_3,0]$ to $\pi_N^{-1}[c_3,w_R-1]$ and $R_N[c_3,0]$ to $R_N[c_3,w_R-1]$ of the deinterleaver pattern $\pi_N^{-1}$ and the rank sequence $R_N$ are read 4719, 4720 from the deinterleaver ROM 4203 and the rank ROM 3801, respectively.

Each successive set of elements read from the deinterleaver ROM 4203 in each successive clock cycle is provided to the second set off logic 4211 shown in FIG. 16. Note that since the first and second sets of f logic are not used simultaneously, they may share the same hardware by multiplexing between the inputs provided in the first sub-process 4701 and those provided in the second sub-process 4702. As shown in FIG. 21, this f logic obtains a set of $w_R$ binary flags by computing $b_2[i]=f(K, M, N, c_3 w_R+i, \pi_N^{-1}[c_3,i])$ of (1) 4722 for each value of $i\in[0,w_R-1]$ 4726, 4727, 4728 in parallel. At the same time, each successive set of elements read from the rank ROM 3801 in each successive clock cycle is provided to the set of $w_R$ comparators 3802 shown in FIG. 16. As shown in FIG. 21, these comparators obtain a set of $w_R$ binary flags 4204 by computing $b_3[i]=R_N[c_3,i]<k$ for each value of $i\in[0, w_R-1]$ in parallel 4723. Then, the binary flags $b_2[0]$ to $b_2[w_R-1]$ and $b_3[0]$ to $b_3[w_R-1]$ are provided to a set of $w_R$ AND gates 4212, which obtain a set of $w_R$ binary flags 3409 by computing $b_4[i]=(b_2[i] \text{ AND } b_3[i])$ for each value of $i\in[0, w_R-1]$ in parallel 4724, as shown in FIG. 21. Tables 22 to 24 illustrate the bit patterns $b_4[0]$ to $b_4[w_R-1]$ 3409 that are generated in each clock cycle of the second sub-process 4702, for examples in which repetition, shortening and puncturing are used.

In each successive clock cycle of the second sub-process 4702, the bit pattern $b_4[0]$ to $b_4[w_R-1]$ may be used to interlace 101 or deinterlace 112 each successive set of $w_R$ uncoded bits in parallel 4725, as shown in FIG. 16 and FIG. 21. Each of the bits in the bit pattern $b_4[0]$ to $b_4[w_R-1]$ having the value '1' indicates that the corresponding uncoded bit is provided by an information or CRC bit. Likewise, each of the bit pattern bits having the value 0 indicates that the corresponding uncoded bit is a frozen bit, which may be scrambled by the UE-ID. During polar encoding, the interlacer of FIG. 16 operates on the basis of First-In First-Out (FIFO) buffering. In each clock cycle, an input FIFO buffer supplies a number of information and CRC bits equal to the number of 1s in the corresponding bit pattern. Meanwhile, a second input FIFO buffer supplies a number of UE-ID scrambled frozen bits equal to the number of 0s in the bit pattern. Alternatively, if UE-ID scrambling is not used and all frozen bits adopt a value of '0', then the second FIFO buffer can be replaced with a circuit that supplies the corresponding number of 0-valued bits. The interlacer 101 of FIG. 16 may then interlace the information, CRC and frozen bits according to the corresponding bit pattern, producing $w_R$ number of uncoded bits in parallel, in each clock cycle of the second sub-process 4702. Likewise, during polar decoding, the deinterlacer 112 of FIG. 16 may perform the reverse operation for $w_R$ number of uncoded bits in each clock cycle, where the information and CRC bits are provided to an output FIFO buffer.

The total number of clock cycles required to complete the frozen bit insertion and removal processes is given by the sum of the number used in each of the first and second sub-processes 4701 and 4702. FIG. 25 characterises the number of clock cycles required to complete the first sub-process 4701 as a function of K and M, for the worst case where $w_Q=1$. When $w_Q$ adopts the value of a higher power of two, the number of clock cycles required may be obtained by linearly scaling down those of FIG. 25 and taking the ceiling. It may be observed that greater numbers of clock cycles are required at coding rates of K/M>7/16, where shortening is employed. This is because shortening uses some of the most reliable uncoded bit positions for frozen bits. A smaller number of clock cycles is required when employing puncturing, since this typically uses the least reliable bit positions for frozen bits. More specifically, the number of clock cycles used in the first sub-process 4701 with $w_Q=1$ is equal to k 3804 in the case of shortening or puncturing. By contrast, no clock cycles are required when employing repetition, as described above. Note however that the first sub-process 4701 may be completed in parallel with CRC generation and interleaving during polar encoding and in parallel with channel interleaving during polar decoding. Owing to this, the first sub-process 4701 does not necessarily impose additional latency. The number of clock cycles required to complete the second sub-process 4702 is given by $\lceil N/w_R \rceil$, as characterised in FIG. 26, for the worst case where $w_R=1$. When $w_R$ adopts the value of a higher power of two, the number of clock cycles required may be obtained by linearly scaling down those of FIG. 26 and taking the ceiling. The second sub-process 4702 can stream uncoded bits into a polar encoder kernal or stream uncoded bits out of a polar decoder kernal alongside their operation, without imposing additional latency.

This section has proposed some examples of hardware implementations that can perform the frozen bit insertion and removal processes for several bits at a time, allowing them to be completed using a small number of clock cycles. More specifically, this allows frozen bits (which may be scrambled using UE-ID bits) to be interlaced with information bits and CRC bits, before polar encoding. Likewise, this allow the frozen bits to be deinterlaced from the information and CRC bits, following polar decoding. Some examples of the proposed hardware implementations do not require circuits for sorting, interleaving or performing other complex operations, nor do they require an excessive amount of ROM for storing pre-computed frozen bit positions or intermediate variables. Some, and in some instances all, operations of the proposed hardware implementations can be performed alongside other polar encoding or decoding operations and so they do not impose any additional latency.

Figure 14:
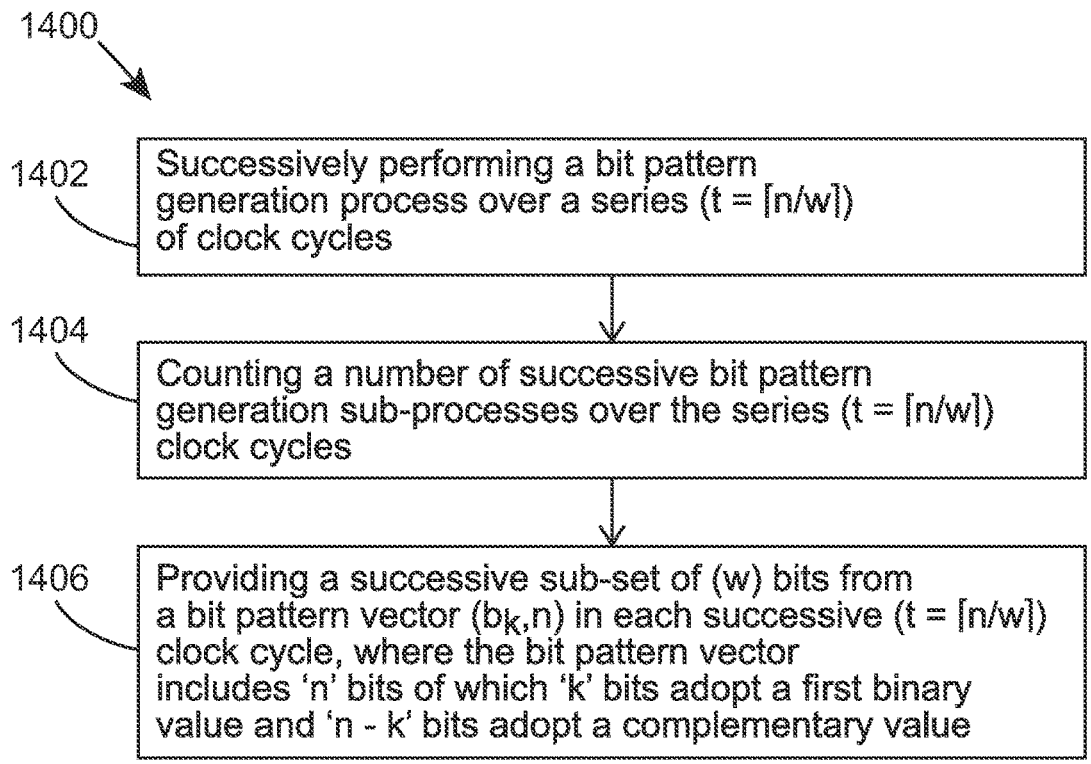
FIG. 14 illustrates a high-level flowchart of a polar coder operations performed by a bit pattern generator in accordance with some example embodiments of the invention.

Referring now to FIG. 14, a high-level flowchart 1400 of a polar coder operation performed by a bit pattern generator is illustrated in accordance with some example embodiments of the invention. The flowchart comprises, at 1402, successively performing a bit pattern generation process over a series ($t=\lceil n/w \rceil$) of clock cycles by a bit pattern generator (3403). At 1404, the flowchart moves to counting a number of successive bit pattern generation sub-processes over the series ($t=\lceil n/w \rceil$) of clock cycles. At 1406, a successive sub-set of (w) bits from a bit pattern vector ($b_{k,n}$) in each successive $t=\lceil n/w \rceil$ clock cycle is provided; where the bit pattern vector comprises 'n' bits, of which 'k' bits adopt a first binary value and n–k bits adopt a complementary binary value.

Figure 15:
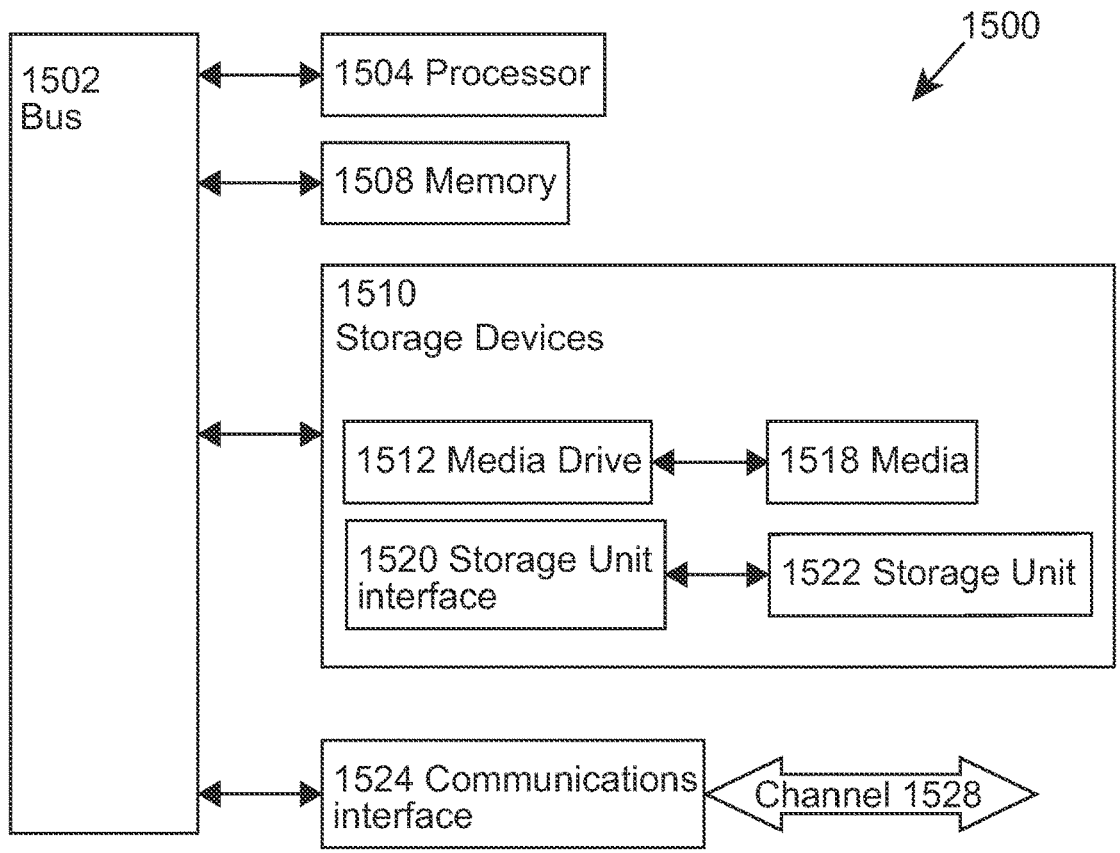
FIG. 15 illustrates a typical computing system that may be employed in an electronic device or a wireless communication unit to perform polar encoding operations in accordance with some example embodiments of the invention.

Referring now to FIG. 15, there is illustrated a typical computing system 1500 that may be employed to implement polar encoding according to some example embodiments of the invention. Computing systems of this type may be used in wireless communication units. Those skilled in the relevant art will also recognize how to implement the invention using other computer systems or architectures. Computing system 1500 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 1500 can include one or more processors, such as a processor 1504. Processor 1504 can be implemented using a general or special-purpose processing engine such as, for example, a microprocessor, microcontroller or other control logic. In this example, processor 1504 is connected to a bus 1502 or other communications medium. In some examples, computing system 1500 may be a non-transitory tangible computer program product comprising executable code stored therein for implementing polar encoding.

Computing system 1500 can also include a main memory 1508, such as random access memory (RAM) or other dynamic memory, for storing information and instructions to be executed by processor 1504. Main memory 1508 also may be used for storing temporary variables or other intermediate information during execution of instructions to be executed by processor 1504. Computing system 1500 may likewise include a read only memory (ROM) or other static storage device coupled to bus 1502 for storing static information and instructions for processor 1504.

The computing system 1500 may also include information storage system 1510, which may include, for example, a media drive 1512 and a removable storage interface 1520. The media drive 1512 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 1518 may include, for example, a hard disk, floppy disk, magnetic tape, optical disk, CD or DVD, or other fixed or removable medium that is read by and written to by media drive 1512. As these examples illustrate, the storage media 1518 may include a computer-readable storage medium having particular computer software or data stored therein.

In alternative embodiments, information storage system 1510 may include other similar components for allowing computer programs or other instructions or data to be loaded into computing system 1500. Such components may include, for example, a removable storage unit 1522 and an interface 1520, such as a program cartridge and cartridge interface, a removable memory (for example, a flash memory or other removable memory module) and memory slot, and other removable storage units 1522 and interfaces 1520 that allow software and data to be transferred from the removable storage unit 1518 to computing system 1500.

Computing system 1500 can also include a communications interface 1524. Communications interface 1524 can be used to allow software and data to be transferred between computing system 1500 and external devices. Examples of communications interface 1524 can include a modem, a network interface (such as an Ethernet or other NIC card), a communications port (such as for example, a universal serial bus (USB) port), a PCMCIA slot and card, etc. Software and data transferred via communications interface 1524 are in the form of signals which can be electronic, electromagnetic, and optical or other signals capable of being received by communications interface 1524. These signals are provided to communications interface 1524 via a channel 1528. This channel 1528 may carry signals and may be implemented using a wireless medium, wire or cable, fibre optics, or other communications medium. Some examples of a channel include a phone line, a cellular phone link, an RF link, a network interface, a local or wide area network, and other communications channels.

In this document, the terms 'computer program product', 'computer-readable medium' and the like may be used generally to refer to media such as, for example, memory 1508, storage device 1518, or storage unit 1522. These and other forms of computer-readable media may store one or more instructions for use by processor 1504, to cause the processor to perform specified operations. Such instructions, generally referred to as 'computer program code' (which may be grouped in the form of computer programs or other groupings), when executed, enable the computing system 1500 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 1500 using, for example, removable storage drive 1522, drive 1512 or communications interface 1524. The control logic (in this example, software instructions or computer program code), when executed by the processor 1504, causes the processor 1504 to perform the functions of the invention as described herein.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The present invention is herein described with reference to an integrated circuit device comprising, say, a microprocessor configured to perform the functionality of a polar decoder. However, it will be appreciated that the present invention is not limited to such integrated circuit devices, and may equally be applied to integrated circuit devices comprising any alternative type of operational functionality. Examples of such integrated circuit device comprising alternative types of operational functionality may include, by way of example only, application-specific integrated circuit (ASIC) devices, field-programmable gate array (FPGA) devices, or integrated with other components, etc. Furthermore, because the illustrated embodiments of the present invention may for the most part, be implemented using electronic components and circuits known to those skilled in the art, details have not been explained in any greater extent than that considered necessary, for the understanding and appreciation of the underlying concepts of the present invention and in order not to obfuscate or distract from the teachings of the present invention. Alternatively, the circuit and/or component examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type. Also, the invention is not limited to physical devices or units implemented in non-programmable hardware but can also be applied in programmable devices or units able to perform the desired polar encoding by operating in accordance with suitable program code, such as minicomputers, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

REFERENCES

[1] E. Arikan, "Channel polarization: A method for constructing capacity-achieving codes for symmetric binary-input memoryless channels," IEEE Transactions on Information Theory, vol. 55, no. 7, pp. 3051-3073, July 2009.

[2] K. Niu and K. Chen, "CRC-aided decoding of polar codes," IEEE Communications Letters, vol. 16, no. 10, pp. 1668-1671, October 2012.

[3] Huawei, HiSilicon, "Polar code construction for NR," in 3GPP TSG RAN WG1 Meeting #86bis, Lisbon, Portugal, October 2016, R1-1608862.

[4] Huawei, HiSilicon, "Evaluation of channel coding schemes for control channel," in 3GPP TSG RAN WG1 Meeting #86bis, Lisbon, Portugal, October 2016, R1-1608863.

[5] CATT, "Polar codes design for eMBB control channel," in 3GPP TSG RAN WG1 AH NR Meeting, Spokane, USA, January 2017, R1-1700242.

[6] ZTE, ZTE Microelectronics, "Rate matching of polar codes for eMBB," in 3GPP TSG RAN WG1 Meeting #88, Athens, Greece, February 2017, R1-1701602.

[7] I. Tal and A. Vardy, "List decoding of polar codes," in 2011 IEEE International Symposium on Information Theory Proceedings, July 2011, pp. 1-5.

[8] Huawei, HiSilicon, "Sequence design for polar codes," in 3GPP TSG RAN WG1 Meeting #89, Hangzhou, China, May 2017, R1-1706966.

[9] Qualcomm Incorporated, "Polar code information bit allocation and nested extension construction," in 3GPP TSG RAN WG1 Meeting #88, Athens, Greece, February 2017, R1-1702646.

[10] Nokia, Alcatel-Lucent Shanghai Bell, "Sequence design for polar codes," in 3GPP TSG RAN WG1 Meeting #89, Hangzhou, China, May 2017, R1-1708834.

[11] NTT DOCOMO, "Sequence design of polar codes," in 3GPP TSG RAN WG1 Meeting #89, Hangzhou, China, May 2017, R1-1708489.

[12] Samsung, "Design of a nested polar code sequences," in 3GPP TSG RAN WG1 Meeting #89, Hangzhou, China, May 2017, R1-1708051.

[13] G. Sarkis, I. Tal, P. Giard, A. Vardy, C. Thibeault, and W. J. Gross, "Flexible and low-complexity encoding and decoding of systematic polar codes," IEEE Transactions on Communications, vol. 64, no. 7, pp. 2732-2745, July 2016.

[14] C. Leroux, A. J. Raymond, G. Sarkis, and W. J. Gross, "A semi-parallel successive-cancellation decoder for polar codes," IEEE Transactions on Signal Processing, vol. 61, no. 2, pp. 289-299, January 2013.

[15] G. Berhault, C. Leroux, C. Jego, and D. Dallet, "Hardware implementation of a soft cancellation decoder for polar codes," in 2015 Conference on Design and Architectures for Signal and Image Processing (DASIP), September 2015, pp. 1-8.

[16] Qualcomm Incorporated, "A comprehensive rate-matching scheme for polar codes and performance evaluation," in 3GPP TSG RAN WG1 Meeting #88bis, Spokane, USA, April 2017, R1-1705634.

[17] Huawei, "Summary of email discussion [NRAH2-11] Polar code sequence," in *3GPP TSG RAN WG1 Meeting* #90, Prague, Czech Republic, August 2017, R1-1712174.

[18] MCC Support, "Draft Report of 3GPP TSG RAN WG1 #90 v0.1.0," in *3GPP TSG RAN WG1 Meeting* #90, Prague, Czech Republic, August 2017.

[19] MediaTek, Qualcomm, Samsung, ZTE, "Way Forward on Rate-Matching for Polar Code," in *3GPP TSG RAN WG1 Meeting* #90, Prague, Czech Republic, August 2017, R1-1715000.

We claim:

1. An electronic device configured to perform polar coding, the electronic device comprising:

a bit pattern generator configured to successively perform a bit pattern generation process over a series of clock cycles;

wherein the bit pattern generator is configured to:

provide a successive sub-set of, w, bits from a bit pattern vector, $b_{k,n}$, in each successive clock cycle; where the bit pattern vector comprises n bits, of which 'k' bits adopt a first binary value and n−k bits adopt a complementary binary value, and wherein the bit pattern generator comprises a bank of (w) comparators, and wherein the successive sub-set of, w, bits cause each of w bit pattern bits $\{b_0, b_1, b_2, \ldots b_{w-1}\}$ to be obtained from a corresponding comparator in the bank of w comparators, and wherein a rank vector, $R_n$, for a length of the bit pattern, 'n', comprises integers in a range of '0' to 'n−1', permuted in an order that corresponds to a rank of each bit position, and wherein the bit pattern vector, $b_{k,n}$, is generated for a respective combination of the number, k, of bits in a bit pattern adopting the first binary value and the length of the bit pattern 'n' using the bank of w comparators that compares each element of the rank vector, $R_n$, with 'k'.

2. The electronic device of claim 1, wherein the bit pattern generator comprises a rank read only memory, ROM, configured to store information sufficient to obtain the rank vector, $R_n$, for each supported length of the bit pattern, 'n'.

3. The electronic device of claim 1, wherein the rank of each bit position indicates a maximum value for the number 'k' out of 'n' bits in the bit pattern adopting the first binary value, for which a corresponding bit in the bit pattern vector, $b_{k,n}$, has a complementary binary value, and wherein each comparison determines whether the element of the rank vector, $R_n$, is less than 'k'.

4. The electronic device of claim 2, wherein at least one of the following is adopted:
 a length of the bit pattern n is used to index a second look-up table, in order to identify a start address of each particular rank vector, $R_n$;
 the rank ROM comprises multiple multiplexed rank ROMs, wherein one multiplexed rank ROM is configured to store the rank vector, $R_n$, corresponding to each supported value of the length of the bit pattern 'n'.

5. The electronic device of claim 2, wherein at least one of the following is adopted:
 all entries in the rank ROM are stored using fixed point numbers having a width of $\log_2(n_{max})$ bits, where $n_{max}$ is a maximum of the supported bit pattern lengths;
 all entries in the rank ROM for values of n are stored using fixed point numbers having a width of $\log_2(n)$ bits.

6. The electronic device of claim 2, wherein each address of the rank ROM is configured to store w fixed-point numbers and wherein the rank ROM, in cases where n<w, is configured to append the rank vector, $R_n$, with w-n dummy elements, such that the rank vector, $R_n$, occupies a width of a single address in the rank ROM.

7. The electronic device of claim 1, wherein a bit pattern bit of the bit pattern vector $b_{k,n}$ is obtained by representing both a rank value and k using a two's complement fixed-point number representation, and the bit pattern generator circuit performs a two's complement subtraction of 'k' from the rank value and then uses a most significant bit, MSB, as a value of the bit pattern bit.

8. The electronic device of claim 1, wherein frozen bit insertion or frozen bit removal within the polar coding is performed by the electronic device and the frozen bit insertion or frozen bit removal comprises at least two sub-processes and the bit pattern generator is configured to provide the successive sub-set of (w) bits from the bit pattern vector ($b_{k,n}$) in each successive clock cycle that spans a duration of a second sub-process that is preceded by a first sub-process that spans a series of zero or more clock cycles and wherein a first logic circuit is arranged to provide during the first sub-process a reliability threshold, k, to an input of the bit pattern generator for use in the second sub-process.

9. The electronic device of claim 8, wherein the electronic device is configured to support at least two modes of operation, where a respective mode of operation is employed in response to whether a number, M, of encoded bits is less than a kernal block size, N and wherein the at least two modes of operation comprise at least two from: a repetition mode of operation when M is not less than N, a shortening mode of operation when M<N, a puncturing mode of operation when M<N.

10. The electronic device of claim 9, wherein the first sub-process has zero clock cycles, and the second sub-process is performed when M is not less than N, and the threshold reliability number, k, is set to a number of K bits that adopt the first binary value in a final output bit sequence.

11. The electronic device of claim 8, further comprising a controller operably coupled to a counter arranged to count a number of clock cycles under control of the controller in the first sub-process when M is less than N, and the first sub-process determines the rank threshold, k, that indicates a number of bits having the first binary value contained in an intermediate value for the bit pattern vector, $b_{k,n}$, output by the bit pattern generator.

12. The electronic device of claim 11, further comprising a second logic circuit configured to successively perform a binary flag generation process over the series of clock cycles that comprise the second sub-process and configured to provide a successive sub-set of w binary flags in each successive clock cycle and wherein a binary flag is set in the binary flag generation process if a corresponding bit in the bit pattern vector, $b_{k,n}$, is not frozen by rate matching.

13. The electronic device of claim 12, further comprising a third logic circuit configured to receive at least a first input from the second logic circuit and a second input from the bit pattern generator wherein the third logic circuit is configured to provide an output of a first binary value when a bit in the subset of w bits of the intermediate bit pattern vector, $b_{k,n}$, from the bit pattern generator adopts the first binary value and a corresponding flag from a plurality of binary flags from the second logic circuit is set, thereby adjusting a bit pattern vector, $b_{k,n}$, of the intermediate bit pattern based on the at least first and second inputs.

14. The electronic device of claim 8, wherein the first logic circuit is arranged to identify the reliability threshold, k, for use in the second sub-process by determining whether each uncoded bit is frozen by rate matching and the first logic circuit comprises a non-frozen bit counter arranged to count a number of uncoded bits that are not frozen by rate matching in order of decreasing reliability during the first sub-process, and once the count reaches the number of final value bits in a final output bit sequence, K, whereupon rank of the $K^{th}$ most reliable unfrozen bit is determined as the rank threshold, k, and the first logic circuit provides the rank threshold k as an input to the bit pattern generator.

15. The electronic device of claim 8, wherein the electronic device further comprises at least one of:
 a set of reversed sequence read only memories, ROMs, located in the first logic circuit configured to store sets of reversed sequences where each successive element of the reversed sequence indicates a position of each successive uncoded bit arranged in order of decreasing reliability;
 a set of deinterleaver ROMs located in the first logic circuit configured to store a set of deinterleaver patterns, where each element of the deinterleaver pattern indicates an interleaved position of a polar encoded bit during rate matching;
 a set of interleaved sequence ROMs located in the first logic circuit configured to store a set of interleaved sequences;
 a second counter, c1, incremented in successive clock cycles of the first sub-process, wherein successive addresses of a reversed sequence ROM and successive addresses of an interleaved sequence ROM, corresponding to a particular value of N are indexed;
 a rank ROM located in the bit pattern generator configured to store information sufficient to obtain a rank vector, $R_n$, for each supported length of the bit pattern, 'n';

a first set of functional logic, f1, located in the first logic circuit and configured to obtain a set of binary flags based on received successive sets of elements read from the set of reversed sequence ROMs and the set of interleaved sequence ROMs in each successive clock cycle; and an accumulator logic circuit located in the first logic circuit and configured to receive and count the set of binary flags up to a number, K, of uncoded bits that are not frozen by rate matching in a final output bit sequence, and the threshold reliability number, k, is set to complete the first sub-process.

16. The electronic device of claim 8, wherein the first logic circuit is configured to identify a frozen bit as the complementary binary value in the bit pattern vector, $b_{k,n}$, and identify using the first binary value in the bit pattern vector, $b_{k,n}$, a bit that comprises one from a group of: an information bit, a cyclic redundancy check, CRC, bit, a parity-check frozen bit, a user equipment identifier, UE-ID, bit, a hash bit.

17. The electronic device of claim 1, wherein the electronic device comprises at least one of: a transmitter comprising an encoder configured to perform the bit pattern generation process, a receiver comprising a decoder configured to perform the bit pattern generation process.

18. An integrated circuit for an electronic device configured to perform polar coding, the integrated circuit comprising:

a bit pattern generator configured to successively perform a bit pattern generation process over a series of clock cycles;

wherein the bit pattern generator is configured to:
provide a successive sub-set of (w) bits from a bit pattern vector ($b_{k,n}$) in each successive clock cycle; where the bit pattern vector comprises n bits, of which 'k' bits adopt a first binary value and n-k bits adopt a complementary binary value and wherein the bit pattern generator comprises a bank of (w) comparators, and wherein the successive sub-set of w bits cause each of w bit pattern bits $\{b_0, b_1, b_2, \ldots, b_{m-1}\}$ to be obtained from a corresponding comparator in the bank of ω comparators, and wherein a rank vector, $R_n$, for a length of the bit pattern, 'n', comprises integers in a range of '0' to 'n−1', permuted in an order that corresponds to a rank of each bit position, and wherein the bit pattern vector, $b_{k,n}$, is generated for a respective combination of the number, k, of bits in a bit pattern adopting the first binary value and the length of the bit pattern 'n' using the bank of w comparators that compares each element of the rank vector, $R_n$ with 'k'.

19. A method of polar coding, wherein the method comprises:

successively performing a bit pattern generation process over a series of clock cycles by a bit pattern generator; and providing a successive sub-set of w bits from a bit pattern vector, $b_{k,n}$, in each successive clock cycle; where the bit pattern vector comprises 'n' bits, of which 'k' bits adopt a first binary value and n−k bits adopt a complementary binary value and wherein the bit pattern generator comprises a bank of w comparators, and wherein the successive sub-set of (w) bits cause each of w bit pattern bits $\{b_0, b_1, b_2, \ldots, b_{w-1}\}$ to be obtained from a corresponding comparator in the bank of w comparators, and wherein a rank vector, $R_n$, for a length of the bit pattern, 'n', comprises integers in a range of '0' to 'n−1', permuted in an order that corresponds to a rank of each bit position, and wherein the bit pattern vector, $b_{k,n}$, is generated for a respective combination of the number, k, of bits in a bit pattern adopting the first binary value and the length of the bit pattern 'n' using the bank of w comparators that compares each element of the rank vector, $R_n$ with 'k'.

20. The method of polar coding of claim 19, wherein the bit pattern generator comprises a rank read only memory, ROM, configured to store information sufficient to obtain the rank vector, $R_n$, for each supported length of the bit pattern, 'n'.

* * * * *